(12) United States Patent
Niu et al.

(10) Patent No.: US 11,127,788 B2
(45) Date of Patent: Sep. 21, 2021

(54) SEMICONDUCTOR DEVICE HAVING MAGNETIC TUNNEL JUNCTION (MTJ) STACK

(71) Applicant: TAIWAN SEMICONDUCTOR MANUFACTURING COMPANY LIMITED, Hsin-Chu (TW)

(72) Inventors: Baohua Niu, Portland, OR (US); Da-Shou Chen, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/400,439

(22) Filed: May 1, 2019

(65) Prior Publication Data

US 2020/0135803 A1 Apr. 30, 2020

Related U.S. Application Data

(60) Provisional application No. 62/753,187, filed on Oct. 31, 2018.

(51) Int. Cl.
| | | |
|---|---|---|
| H01L 27/22 | (2006.01) | |
| H01L 43/02 | (2006.01) | |
| H01L 43/12 | (2006.01) | |
| H01L 43/08 | (2006.01) | |
| G11C 11/16 | (2006.01) | |
| G01R 33/09 | (2006.01) | |
| G11B 5/39 | (2006.01) | |
| H01L 43/10 | (2006.01) | |

(52) U.S. Cl.
CPC .......... *H01L 27/228* (2013.01); *G11C 11/161* (2013.01); *H01L 43/02* (2013.01); *H01L 43/12* (2013.01); *G01R 33/098* (2013.01); *G11B 5/3909* (2013.01); *G11C 2211/5615* (2013.01); *H01L 43/08* (2013.01); *H01L 43/10* (2013.01)

(58) Field of Classification Search
CPC ....... H01L 27/228; H01L 43/02; H01L 43/12; H01L 43/08; G11C 11/161; G11C 2211/5615; G01R 33/098; G11B 5/3909
See application file for complete search history.

(56) References Cited

U.S. PATENT DOCUMENTS

| | | | | |
|---|---|---|---|---|
| 1,009,064 | A | | 11/1911 | Gobbe |
| 6,153,443 | A | * | 11/2000 | Durlam ................. H01L 27/115 438/3 |
| 6,621,730 | B1 | * | 9/2003 | Lage ....................... H01L 43/12 365/158 |

(Continued)

FOREIGN PATENT DOCUMENTS

| | | |
|---|---|---|
| JP | 2005109470 A | 4/2005 |
| TW | I628817 B | 7/2018 |

*Primary Examiner* — Ida M Soward
(74) *Attorney, Agent, or Firm* — Cooper Legal Group LLC

(57) ABSTRACT

A semiconductor device is provided. The semiconductor device has a semiconductor layer including a source/drain region, a first magnetic layer over the semiconductor layer, and a first dielectric layer over the source/drain region and adjacent the first magnetic layer. The semiconductor device has a metal structure extending through the first dielectric layer, a second magnetic layer over the metal structure, and a second dielectric layer over the first magnetic layer and adjacent the first dielectric layer.

20 Claims, 14 Drawing Sheets

(56) References Cited

U.S. PATENT DOCUMENTS

| | | | |
|---|---|---|---|
| 6,977,181 B1* | 12/2005 | Raberg | B82Y 10/00 257/E21.665 |
| 6,998,665 B2* | 2/2006 | Motoyoshi | H01F 10/3254 257/300 |
| 7,723,827 B2* | 5/2010 | Katoh | H01L 27/228 257/659 |
| 8,937,832 B2* | 1/2015 | Kitagawa | G11C 11/1695 365/158 |
| 9,660,183 B2* | 5/2017 | Wang | H01L 43/08 |
| 9,786,839 B2* | 10/2017 | Bhushan | H01L 43/02 |
| 9,865,649 B2* | 1/2018 | Tan | H01L 23/5226 |
| 9,923,137 B2 | 3/2018 | Tahmasebi et al. | |
| 10,102,893 B2 | 10/2018 | Lee | |
| 10,199,572 B2* | 2/2019 | Yi | H01L 43/12 |
| 10,276,794 B1* | 4/2019 | Peng | H01L 45/1616 |
| 10,283,700 B2* | 5/2019 | Lin | H01L 43/02 |
| 10,446,607 B2* | 10/2019 | Yi | H01L 27/228 |
| 10,658,571 B2* | 5/2020 | Hsu | H01L 27/226 |
| 2004/0175596 A1* | 9/2004 | Inomata | H01F 10/3254 428/811.2 |
| 2006/0033133 A1* | 2/2006 | Liu | H01L 27/228 257/295 |
| 2013/0001715 A1* | 1/2013 | Yamakawa | H01L 27/228 257/421 |
| 2016/0118578 A1* | 4/2016 | Park | H01L 27/228 438/3 |
| 2016/0163254 A1* | 6/2016 | Lee | G11C 11/161 345/545 |
| 2016/0268499 A1* | 9/2016 | You | H01L 43/12 |
| 2016/0322090 A1* | 11/2016 | Chan | H01L 27/228 |
| 2016/0351792 A1* | 12/2016 | Jiang | H01L 43/08 |
| 2016/0359100 A1* | 12/2016 | Bhushan | H01L 23/552 |
| 2017/0213790 A1* | 7/2017 | Wang | H01L 21/76877 |
| 2018/0138237 A1 | 5/2018 | Yakabe et al. | |
| 2018/0211996 A1 | 7/2018 | Lee et al. | |
| 2018/0233661 A1* | 8/2018 | Lin | H01L 23/544 |
| 2018/0366517 A1* | 12/2018 | Lin | H01L 43/02 |
| 2019/0165259 A1* | 5/2019 | Liao | H01L 27/228 |
| 2019/0334079 A1* | 10/2019 | Rahman | H01L 43/08 |
| 2020/0006628 A1* | 1/2020 | O'Brien | H01F 41/302 |
| 2020/0035908 A1* | 1/2020 | Ku | H01L 27/228 |
| 2020/0075669 A1* | 3/2020 | Chuang | H01L 43/08 |
| 2020/0083286 A1* | 3/2020 | Manipatruni | H01L 29/66439 |
| 2020/0098410 A1* | 3/2020 | Gosavi | B82Y 10/00 |
| 2020/0144484 A1* | 5/2020 | Chen | H01L 27/228 |
| 2020/0152864 A1* | 5/2020 | Wu | H01L 27/228 |

* cited by examiner

SEMICONDUCTOR DEVICE HAVING MAGNETIC TUNNEL JUNCTION (MTJ) STACK

RELATED APPLICATIONS

This application claims priority to U.S. Provisional Application 62/753,187, titled "SEMICONDUCTOR ARRANGEMENT AND METHOD FOR MANUFACTURE" and filed on Oct. 31, 2018, which is incorporated herein by reference.

BACKGROUND

Magnetic random access memory (MRAM) is a technology for storing data. MRAM stores data based on a resistance of a magnetic tunnel junction (MTJ) device within an MRAM cell. The MTJ device typically comprises two magnetic layers separated by an insulator layer. Data is written to the MRAM cell by altering a magnetic field direction of one of the magnetic layers of the MTJ device. The magnetic field direction affects the resistance of the MTJ device, thereby storing the written data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
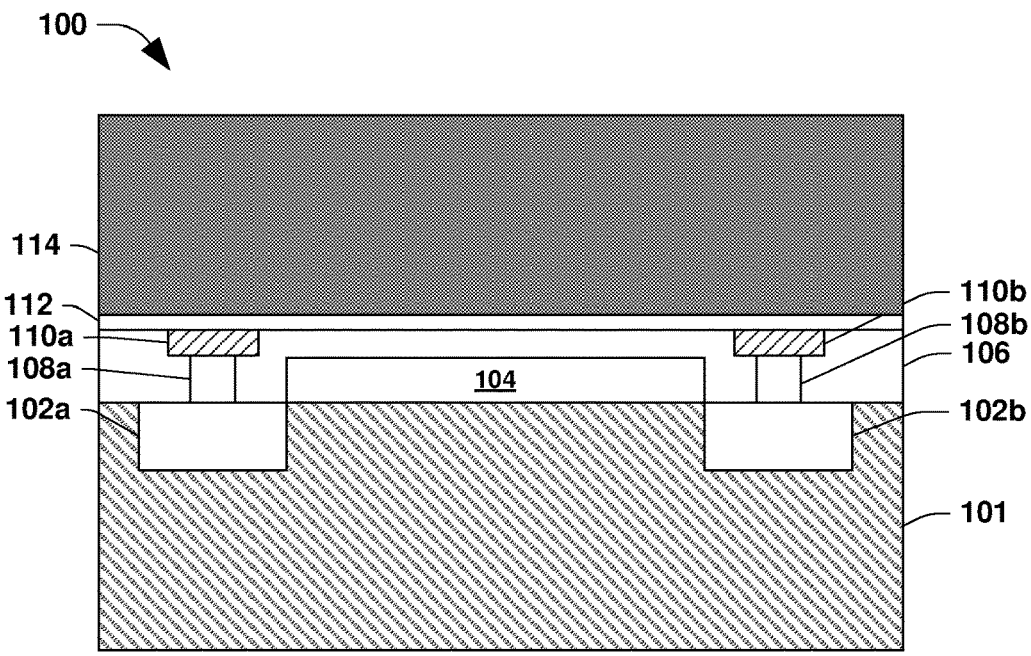
FIGS. 1-8 are illustrations of a semiconductor device at various stages of fabrication, in accordance with one or more embodiments.

The following disclosure provides many different embodiments, or examples, for implementing different features of the provided subject matter. Specific examples of components and devices are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor device are provided herein. In some embodiments, the semiconductor device comprises an MTJ device of MRAM.

Turning to FIG. 1, at least some of a semiconductor device 100 is formed on a substrate 101. In some embodiments, the substrate 101 comprises at least one of an epitaxial layer, a silicon-on-insulator (SOI) structure, a wafer, or a die formed from a wafer. In some embodiments, the substrate 101 comprises at least one of silicon, germanium, carbide, gallium, arsenide, germanium, arsenic, indium, oxide, sapphire, or other suitable materials. In some embodiments, the substrate 101 is at least one of a p-type substrate (P-substrate) or an n-type substrate (N-substrate). In some embodiments, the substrate 101 comprises at least one of a doped epitaxial layer, a gradient semiconductor layer, or a plurality of semiconductor layers where one or more of the semiconductor layers are of a different type than another layer of the plurality of semiconductor layers. In some embodiments, the substrate 101 comprises at least one of a p-well or an n-well.

According to some embodiments, the substrate 101 includes an insulator layer. In some embodiments, the insulator layer comprises at least one of silicon oxide, sapphire, or other suitable materials. In some embodiments, the insulator layer comprises a buried oxide layer (BOX). In some embodiments, the insulator layer is formed by at least one of implantation, oxidation, deposition, or other suitable techniques. In some embodiments, the insulator layer is a component of a SOI structure.

Still referring to FIG. 1, a first source/drain region 102a and a second source/drain region 102b are formed in the substrate 101. The first source/drain region 102a is coupled to a first contact 110a by a conductive member 108a, such as a first via. The second source/drain region 102b is coupled to a second contact 110b by a conductive member 108b, such as a second via. In some embodiments, at least one of the first source/drain region 102a or the second source/drain region 102b is formed by at least one of ion implantation, in situ doping, or other suitable techniques. A gate stack 104, including a gate electrode, is formed over the substrate 101.

A first dielectric layer 106 is formed over at least one of the substrate 101, the gate stack 104, the first source/drain region 102a, or the second source/drain region 102b. According to some embodiments, the first dielectric layer 106 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In some embodiments, the first dielectric layer 106 comprises at least one of a metal nitride, a high-k dielectric, a rare earth oxide, an aluminate of a rare earth oxide, a silicate of a rare earth oxide, or other suitable materials. According to some embodiments, the first dielectric layer 106 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials. According to some embodiments, one or more openings are formed in the first dielectric layer 106, such as by etching, and at least one of the first contact 110a, the conductive member 108a, the second contact 110b, or the conductive member 108b are formed in the at least one of the one or more openings.

Still referring to FIG. 1, an etch stop layer 112 is formed over the first dielectric layer 106. In some embodiments, the etch stop layer 112 is formed by at least one of PVD, sputtering, CVD, LPCVD, ALCVD, UHVCVD, RPCVD, MBE, LPE, or other suitable techniques. In some embodiments, the etch stop layer 112 comprises at least one of silicon oxynitride (SiON), SiN, SiC, carbon doped silicon oxide, or other suitable materials.

Still referring to FIG. 1, a second dielectric layer 114 is formed over the etch stop layer 112. According to some embodiments, the second dielectric layer 114 is formed by at least one of PVD, sputtering, CVD, LPCVD, ALCVD, UHVCVD, RPCVD, MBE, LPE, or other suitable techniques. In some embodiments, the second dielectric layer 114 comprises at least one of a metal nitride, a high-k dielectric, a rare earth oxide, an aluminate of a rare earth oxide, a silicate of a rare earth oxide, or other suitable materials. According to some embodiments, the second dielectric layer 114 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials.

Figure 2:
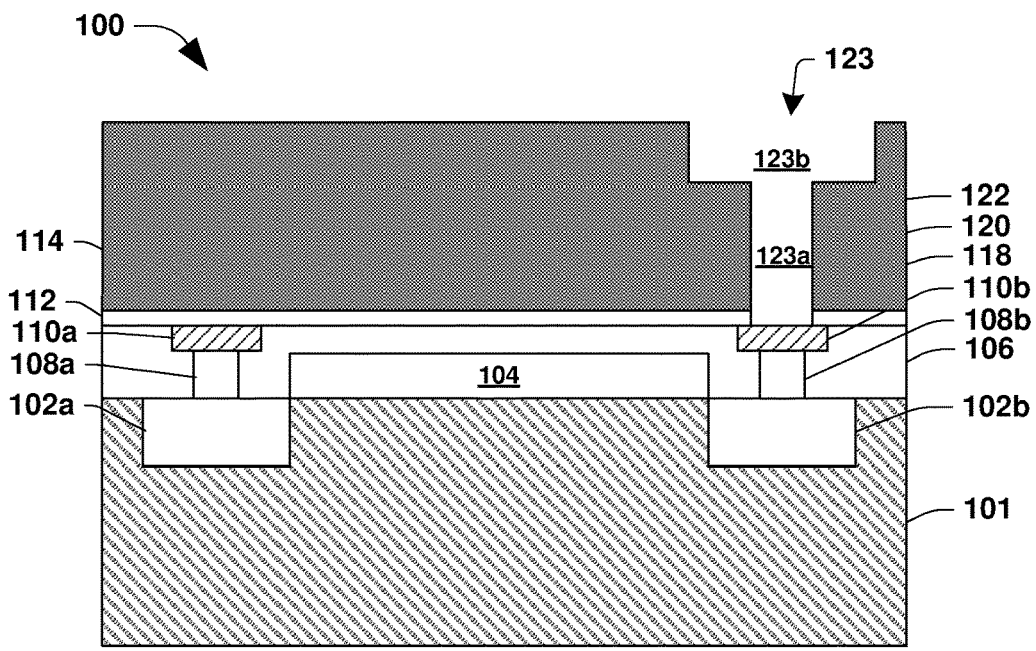

Referring to FIG. 2, according to some embodiments, the second dielectric layer 114 and the etch stop layer 112 are patterned to form an opening 123 and expose the second contact 110b. In some embodiments, the opening 123 has a via portion 123a and a trench portion 123b. In some embodiments, at least one of the second dielectric layer 114 or the etch stop layer 112 are patterned by a dual damascene process. In some embodiments, at least one of the second dielectric layer 114 or the etch stop layer 112 are patterned by at least one of plasma etching, reactive ion etching (RIE), wet etching, or other suitable techniques. In some embodiments, a photoresist is used in patterning at least one of the second dielectric layer 114 or the etch stop layer 112, where the photoresist comprises a light sensitive material such that properties, such as solubility, of the photoresist are affected by light. The photoresist is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of a template between a light source and the positive photoresist.

Figure 3:
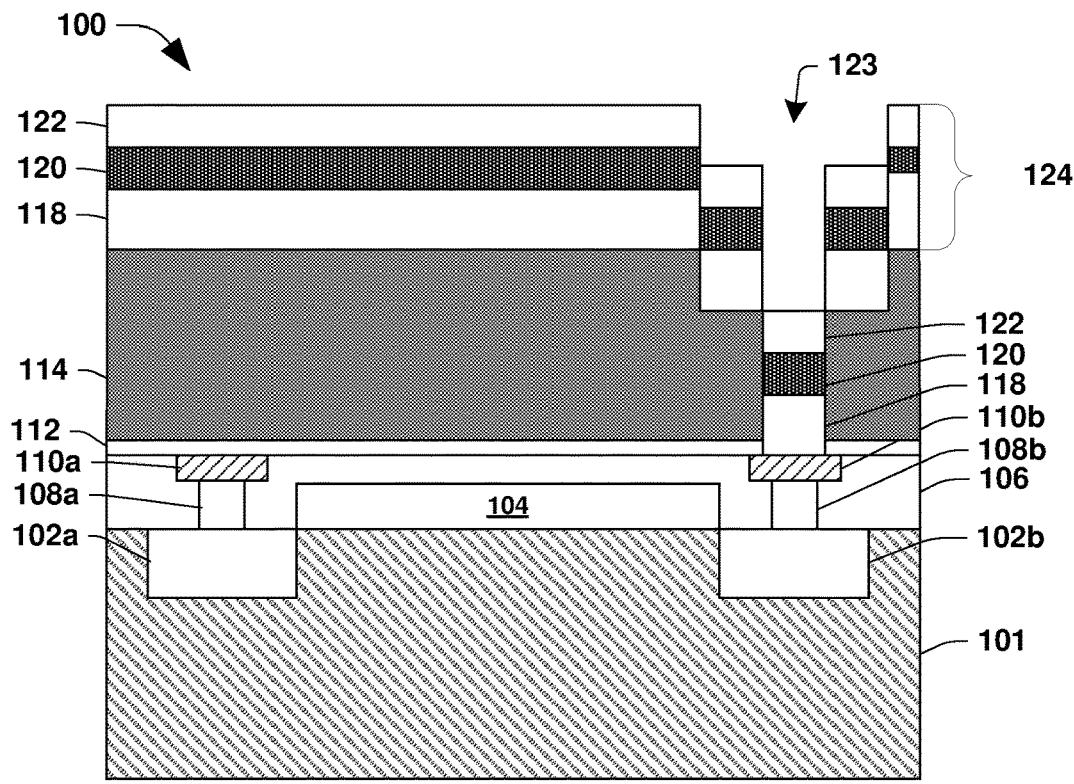

FIG. 3 illustrates a first magnetic layer 118 formed over the second dielectric layer 114 and in the opening 123. In some embodiments, a portion of the first magnetic layer 118 is formed over the second contact 110b and adjacent to at least one of a sidewall of the etch stop layer 112 or a sidewall of the second dielectric layer 114 that defines the opening 123. As used herein, the term adjacent refers to two objects being laterally co-planar such that a plane extending parallel to a top surface of the substrate 101 intersects both objects. Unless otherwise noted, adjacent is not intended to imply that the objects are in direct contact with each other, although the two objects may be both adjacent to and in contact with each other. In some embodiments, a portion of the first magnetic layer 118 contacts at least one of a sidewall of the etch stop layer 112 or a sidewall of the second dielectric layer 114 that defines the opening 123.

The first magnetic layer 118 is formed, in some embodiments, by at least one of PVD, sputtering, CVD, LPCVD, ALCVD, UHVCVD, RPCVD, MBE, LPE, or other suitable techniques. According to some embodiments, the first magnetic layer 118 is formed to have a permanent magnetization direction. In some embodiments, the first magnetic layer 118 comprises at least one of Ni, Fe, Mn, Co, CoFeB, CoFe, NiFe, NiMnSb, PtMnSb, PtMnSb, $Fe_3O_4$, $CrO_2$, CoCr, CoPt, CoCrPt, CoFe, CoFeCr, CoFePt, CoFeCrPt, or other suitable materials.

Still referring to FIG. 3, according to some embodiments, a tunnel layer 120 is formed over the first magnetic layer 118 and in the opening 123. In some embodiments, a portion of the tunnel layer 120 is formed over the second contact 110b and adjacent to at least one of the sidewall of the etch stop layer 112 or the sidewall of the second dielectric layer 114 that defines the opening 123. According to some embodiments, the tunnel layer 120 comprises a non-magnetic material. According to some embodiments, the tunnel layer 120 comprises an insulator material. In some embodiments, the tunnel layer 120 comprises at least one of magnesium oxide (MgO), $Al_2O_3$, aluminum nitride (AlN), aluminum oxynitride (AlON), or other suitable materials. In some embodiments, the tunnel layer 120 has a thickness between 5 angstroms and 15 angstroms. In some embodiments, the tunnel layer 120 is formed by at least one of PVD, sputtering, CVD, LPCVD, ALCVD, UHVCVD, RPCVD, MBE, LPE, or other suitable techniques.

Still referring to FIG. 3, according to some embodiments, a second magnetic layer 122 is formed over the tunnel layer 120 and in the opening 123. In some embodiments, a portion of the second magnetic layer 122 is formed over the second contact 110b and adjacent to at least one of the sidewall of the etch stop layer 112 or the sidewall of the second dielectric layer 114 that defines the opening 123. According to some embodiments, the second magnetic layer 122 is formed to have a permanent magnetization direction. According to some embodiments, the second magnetic layer 122 comprises at least one of Ni, Fe, Mn, Co, CoFeB, CoFe, NiFe, NiMnSb, PtMnSb, PtMnSb, $Fe_3O_4$, $CrO_2$, CoCr, CoPt, CoCrPt, CoFe, CoFeCr, CoFePt, CoFeCrPt, or other suitable materials. The second magnetic layer 122 is formed by at least one of PVD, sputtering, CVD, LPCVD, ALCVD, UHVCVD, RPCVD, MBE, LPE, or other suitable techniques. According to some embodiments, the first magnetic layer 118 and the second magnetic layer 122 have a same material composition.

The first magnetic layer 118, the tunnel layer 120, and the second magnetic layer 122 are, at times, referred to as an MTJ stack 124. In some embodiments, the MTJ stack 124 has a fully or partially cylindrical shape. In some embodiments, the MTJ stack 124 has a fully or partially rectangular shape. The MTJ stack 124, in some embodiments, comprises at least one of one or more other magnetic layers or one or more other non-magnetic layers.

Figure 4:
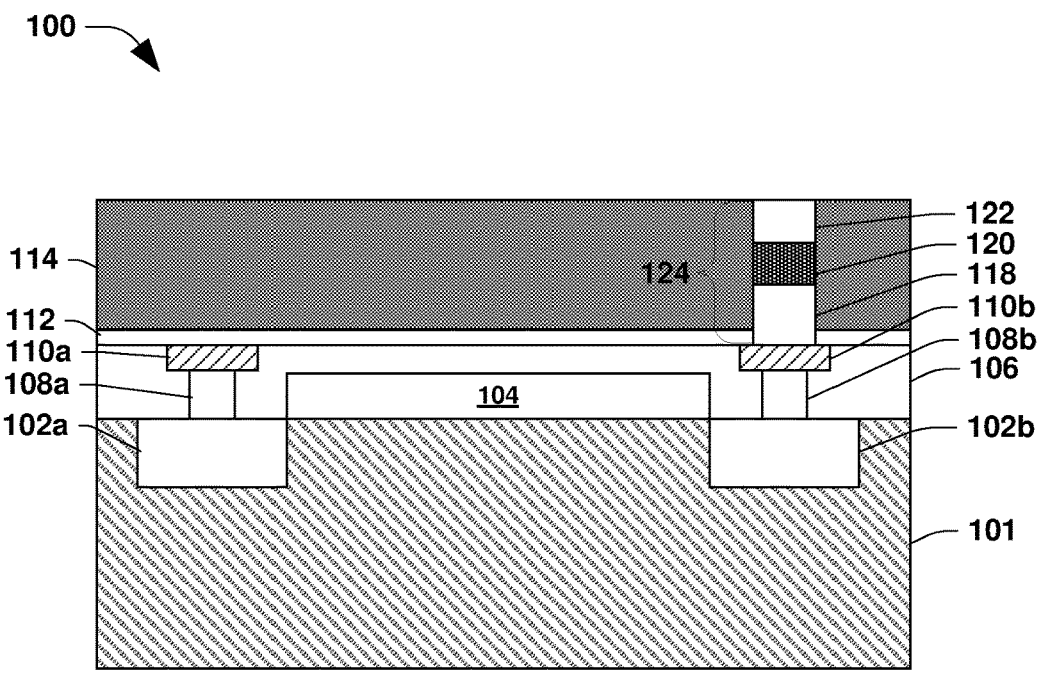

Referring to FIG. 4, according to some embodiments, portions of the MTJ stack 124 not in the via portion 123a (referenced in FIG. 2) of the opening 123 and a portion of the second dielectric layer 114 defining the trench portion 123b of the opening 123 are removed. According to some embodiments, at least one of the portions of the MTJ stack 124 not in the via portion 123a of the opening 123 or the portion of the second dielectric layer 114 defining the trench portion 123b of the opening 123 are removed by at least one of chemical-mechanical planarization (CMP) or other suitable techniques. In some embodiments, an uppermost surface of the MTJ stack 124 is coplanar with an uppermost surface of the second dielectric layer 114.

Figure 5:
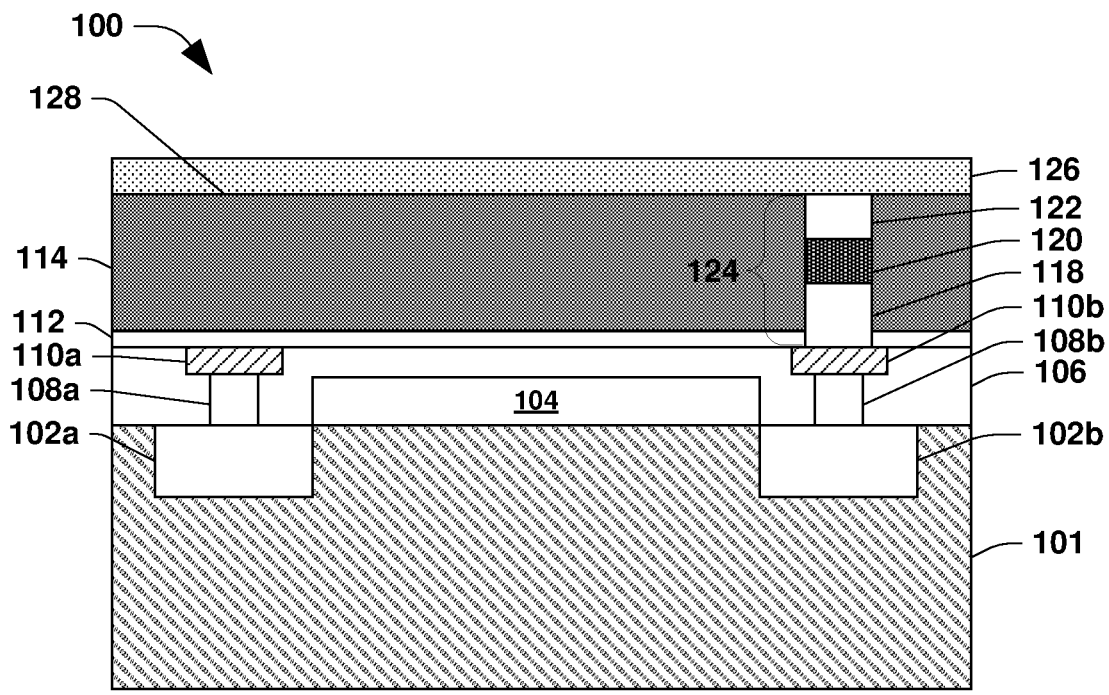

Referring to FIG. 5, a third dielectric layer 126 is formed over the second dielectric layer 114 and the MTJ stack 124, according to some embodiments. According to some embodiments, the third dielectric layer 126 is formed by at least one of PVD, sputtering, CVD, LPCVD, ALCVD, UHVCVD, RPCVD, MBE, LPE, or other suitable techniques. In some embodiments, the third dielectric layer 126 comprises at least one of a metal nitride, a high-k dielectric, a rare earth oxide, an aluminate of a rare earth oxide, a silicate of a rare earth oxide, or other suitable materials. According to some embodiments, the third dielectric layer 126 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials. According to some embodiments, the second dielectric layer 114 and the third dielectric layer 126 have a same material composition.

Still referring to FIG. 5, according to some embodiments, a first interface 128 is defined where the third dielectric layer 126 contacts the second dielectric layer 114.

Figure 6:
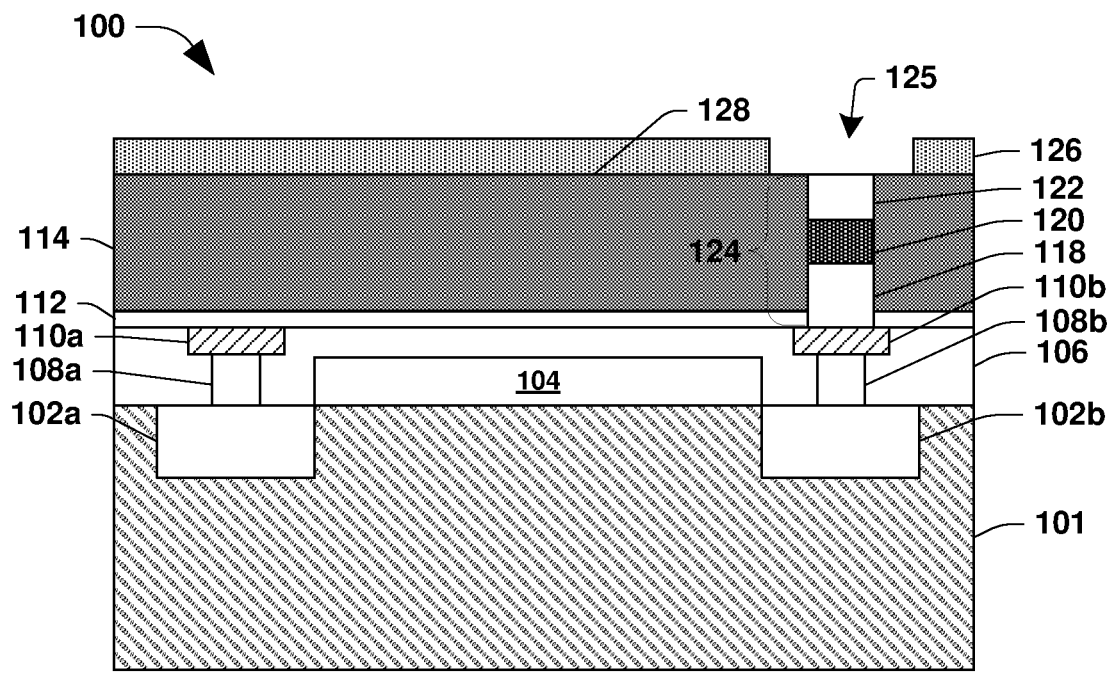

Referring to FIG. 6, the third dielectric layer 126 is patterned to form a second opening 125 and expose the MTJ stack 124, according to some embodiments. According to some embodiments, the third dielectric layer 126 is patterned by at least one of plasma etching, RIE, wet etching, or other suitable techniques. In some embodiments, a photoresist is used in patterning the third dielectric layer 126.

Figure 7:
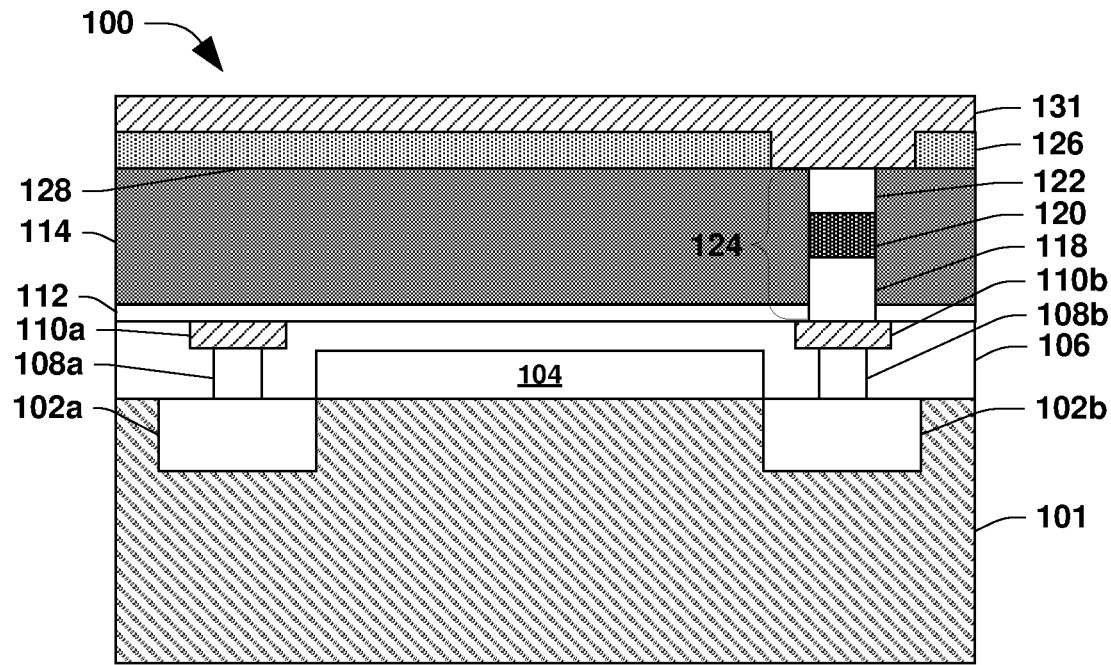

Referring to FIG. 7, a layer of conductive material 131 is formed over the third dielectric layer 126 and in the second opening 125 over the MTJ stack 124. According to some embodiments, the layer of conductive material 131 comprises at least one of Co, Ni, W, Ti, Ta, Cu, Al, Mo, TiN, TaN, WSi, Ni—Si, Co—Si, WN, TiAlN, TaCN, TaC, TaSiN, or other suitable materials. According to some embodiments, the layer of conductive material 131 is formed by at least one of PVD, sputtering, CVD, LPCVD, ALCVD, UHVCVD, RPCVD, MBE, LPE, electrochemical plating (ECP), or other suitable techniques.

Figure 8:
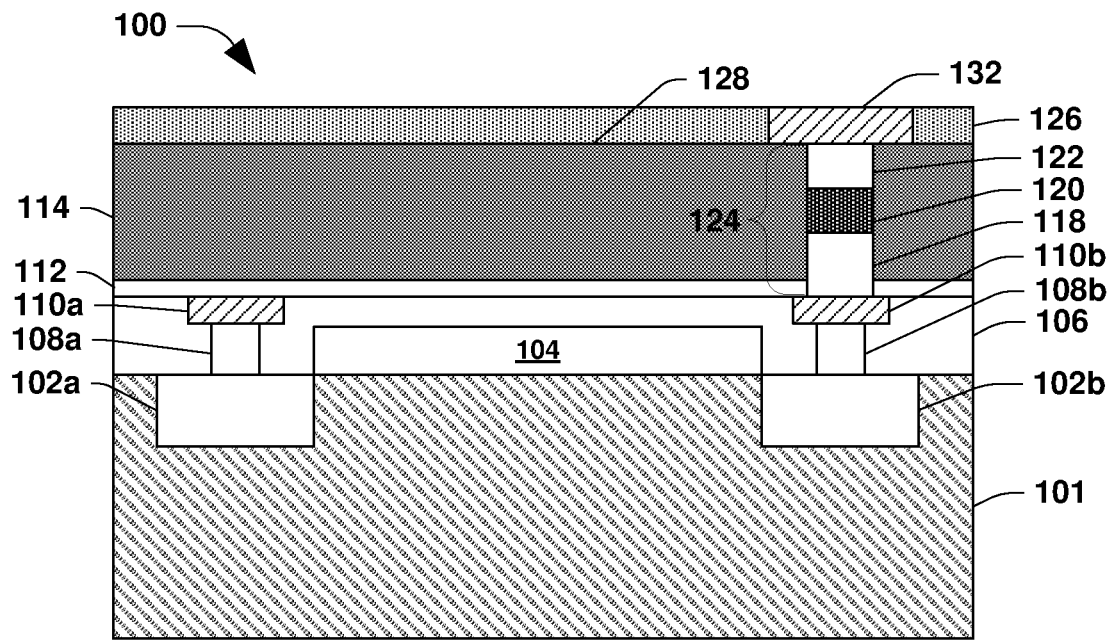

Referring to FIG. 8, portions of the layer of conductive material 131 not in the second opening 125 are removed to form an electrode 132 over the MTJ stack 124. According to some embodiments, the electrode 132 is electromagnetically coupled with the MTJ stack 124. According to some embodiments, the portions of the layer of conductive material 131 not in the second opening 125 are removed by at least one of CMP, or other suitable techniques. In some embodiments, an uppermost surface of the electrode 132 is coplanar with an uppermost surface of the third dielectric layer 126.

According to some embodiments, the semiconductor device 100 includes an electrical connection to the second source/drain region 102b by way of the electrode 132, the MTJ stack 124, the second contact 110b, and the conductive member 108b. According to some embodiments, data is written to the semiconductor device 100 by altering a magnetic field direction of one of the magnetic layers of the MTJ stack 124.

Figure 9:
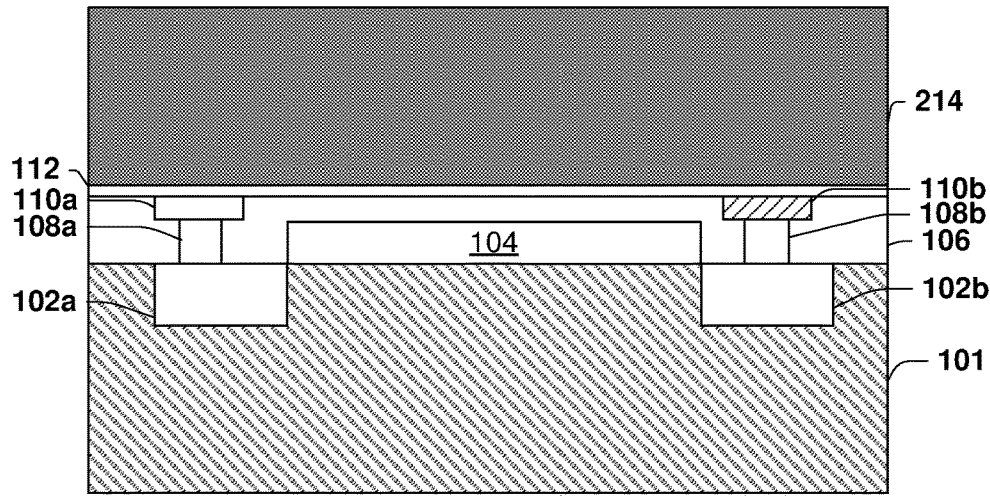
FIGS. 9-17 are illustrations of a semiconductor device at various stages of fabrication, in accordance with one or more embodiments.

Turning to FIG. 9, at least some of a semiconductor device 200 is formed on a substrate 101. In some embodiments, the substrate 101 comprises at least one of an epitaxial layer, a silicon-on-insulator (SOI) structure, a wafer, or a die formed from a wafer. In some embodiments, the substrate 101 comprises at least one of silicon, germanium, carbide, gallium, arsenide, germanium, arsenic, indium, oxide, sapphire, or other suitable materials. In some embodiments, the substrate 101 is at least one of a p-type substrate (P-substrate) or an n-type substrate (N-substrate). In some embodiments, the substrate 101 comprises at least one of a doped epitaxial layer, a gradient semiconductor layer, or a plurality of semiconductor layers where one or more of the semiconductor layers are of a different type than another layer of the plurality of semiconductor layers. In some embodiments, the substrate 101 comprises at least one of a p-well or an n-well.

According to some embodiments, the substrate 101 includes an insulator layer. In some embodiments, the insulator layer comprises at least one of silicon oxide, sapphire, or other suitable materials. In some embodiments, the insulator layer comprises a buried oxide layer (BOX). In some embodiments, the insulator layer is formed by at least one of implantation, oxidation, deposition, or other suitable techniques. In some embodiments, the insulator layer is a component of a SOI structure.

Still referring to FIG. 9, a first source/drain region 102a and a second source/drain region 102b are formed in the substrate 101. The first source/drain region 102a is coupled to a first contact 110a by a conductive member 108a. The second source/drain region 102b is coupled to a second contact 110b by a conductive member 108b. In some embodiments, at least one of the first source/drain region 102a or the second source/drain region 102b is formed by at least one of ion implantation, in situ doping, or other suitable techniques. A gate stack 104, including a gate electrode, is formed over the substrate 101.

A first dielectric layer 106 is formed over at least one of the substrate 101, the gate stack 104, the first source/drain region 102a, or the second source/drain region 102b. According to some embodiments, the first dielectric layer 106 is formed by at least one of PVD, sputtering, CVD, LPCVD, ALCVD, UHVCVD, RPCVD, MBE, LPE, or other suitable techniques. In some embodiments, the first dielectric layer 106 comprises at least one of a metal nitride, a high-k dielectric, a rare earth oxide, an aluminate of a rare earth oxide, a silicate of a rare earth oxide, or other suitable materials. According to some embodiments, the first dielectric layer 106 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials. According to some embodiments, one or more openings are formed in the first dielectric layer 106, such as by etching, and at least one of the first contact 110a, the conductive member 108a, the second contact 110b, or the conductive member 108b are formed in the at least one of the one or more openings.

Still referring to FIG. 9, an etch stop layer 112 is formed over the first dielectric layer 106. In some embodiments, the etch stop layer 112 is formed by at least one of PVD, sputtering, CVD, LPCVD, ALCVD, UHVCVD, RPCVD, MBE, LPE, or other suitable techniques. In some embodiments, the etch stop layer 112 comprises at least one of SiON, SiN, SiC, carbon doped silicon oxide, or other suitable materials.

Still referring to FIG. 9, a second dielectric layer 214 is formed over the etch stop layer 112. According to some embodiments, the second dielectric layer 214 is formed by at least one of PVD, sputtering, CVD, LPCVD, ALCVD, UHVCVD, RPCVD, MBE, LPE, or other suitable techniques. In some embodiments, the second dielectric layer 214 comprises at least one of a metal nitride, a high-k dielectric, a rare earth oxide, an aluminate of a rare earth oxide, a silicate of a rare earth oxide, or other suitable materials. According to some embodiments, the second dielectric layer 214 comprises at least one of SiN, SiO$_2$, Si$_3$N$_4$, TiO$_2$, Ta$_2$O$_5$, ZrO$_2$, Y$_2$O$_3$, La$_2$O$_5$, HfO$_2$, or other suitable materials.

Figure 10:
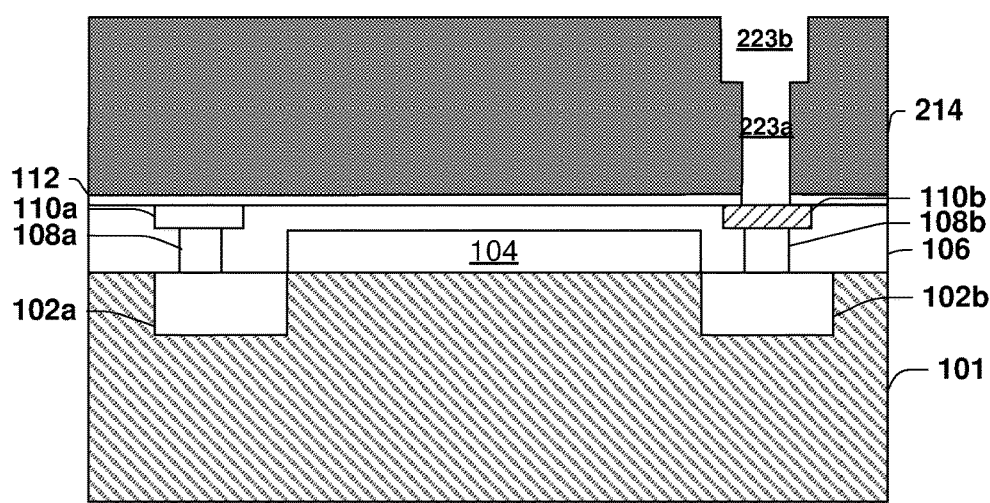

Referring to FIG. 10, according to some embodiments, the second dielectric layer 214 and the etch stop layer 112 are patterned to form a first opening 223 and expose the second contact 110b. In some embodiments, the opening 223 has a via portion 223a and a trench portion 223b. In some embodiments, at least one of the second dielectric layer 214 or the etch stop layer 112 are patterned by a dual damascene process. In some embodiments, at least one of the second dielectric layer 214 or the etch stop layer 112 are patterned by at least one of plasma etching, reactive ion etching (RIE), wet etching, or other suitable techniques. In some embodiments, a photoresist is used in patterning at least one of the second dielectric layer 214 or the etch stop layer 112.

Figure 11:
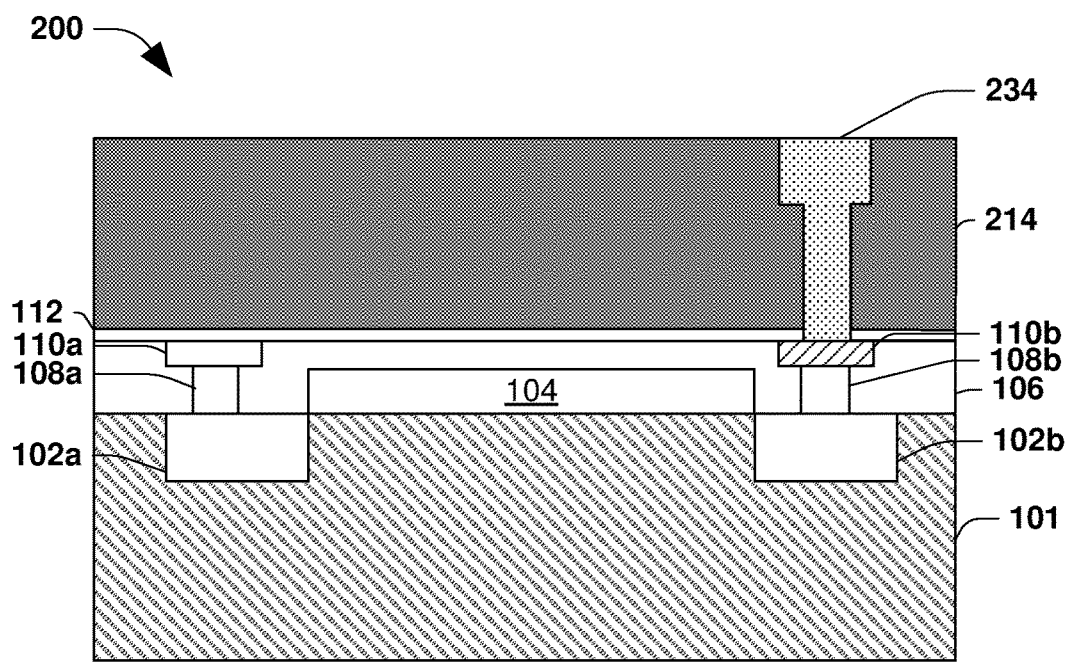

Referring to FIG. 11, in some embodiments, a metal structure 234 is formed in the via portion 223a and the trench portion 223b of the first opening 223 and over the second contact 110b. In some embodiments, the metal structure 234 comprises at least one of Co, Ni, W, Ti, Ta, Cu, Al, Mo, TiN, TaN, WSi, Ni—Si, Co—Si, WN, TiAlN, TaCN, TaC, TaSiN, or other suitable materials. In some embodiments, the metal structure 234 is formed by at least one of PVD, sputtering, CVD, LPCVD, ALCVD, UHVCVD, RPCVD, MBE, LPE, ECP, or other suitable techniques. In some embodiments, the metal structure 234 is subjected to chemical mechanical polishing. In some embodiments, an uppermost surface of the metal structure 234 is coplanar with an uppermost surface of the second dielectric layer 214.

Figure 12:
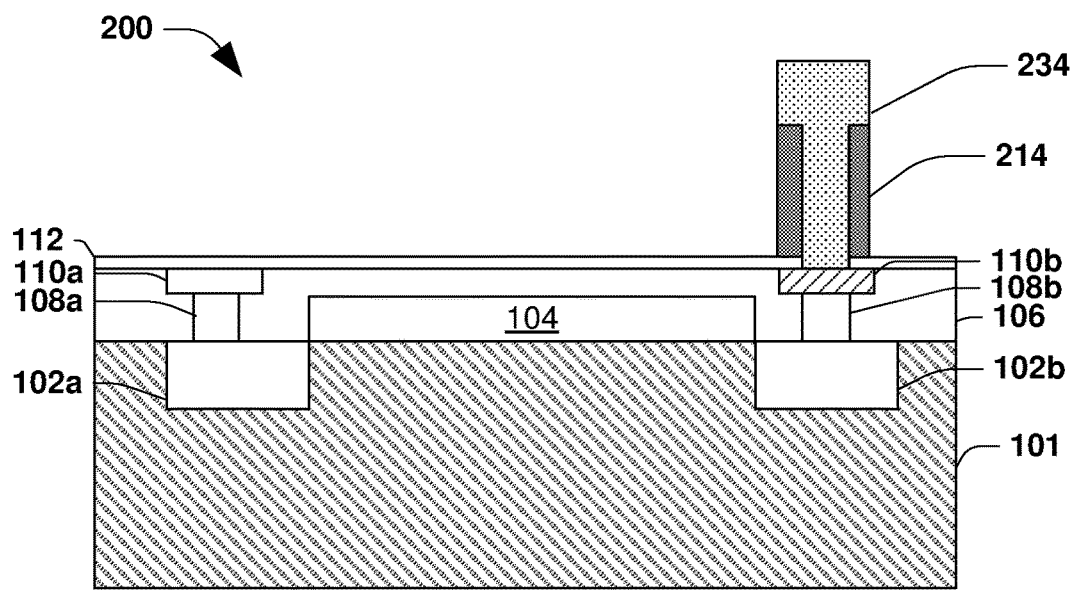

Referring to FIG. 12, in some embodiments, the second dielectric layer 214 is removed. According to some embodiments, the second dielectric layer 214 is removed by at least one of plasma etching, RIE, wet etching. According to some embodiments, a portion or remnant of the second dielectric layer 214 underlying (or covered by) a portion of the metal structure 234 formed in the trench portion 223b of the first opening 223 remains. In some embodiments, a photoresist is used in removing the second dielectric layer 214. In some embodiments, an etch selectivity of the metal structure 234 is sufficiently different from the etch selectivity of the second dielectric layer 214 that the metal structure 234 functions as a hard mask to protect the portion or remnant of the second dielectric layer 214 underlying (or covered by) the metal structure 234 from being removed during the removal process of the second dielectric layer.

Figure 13:
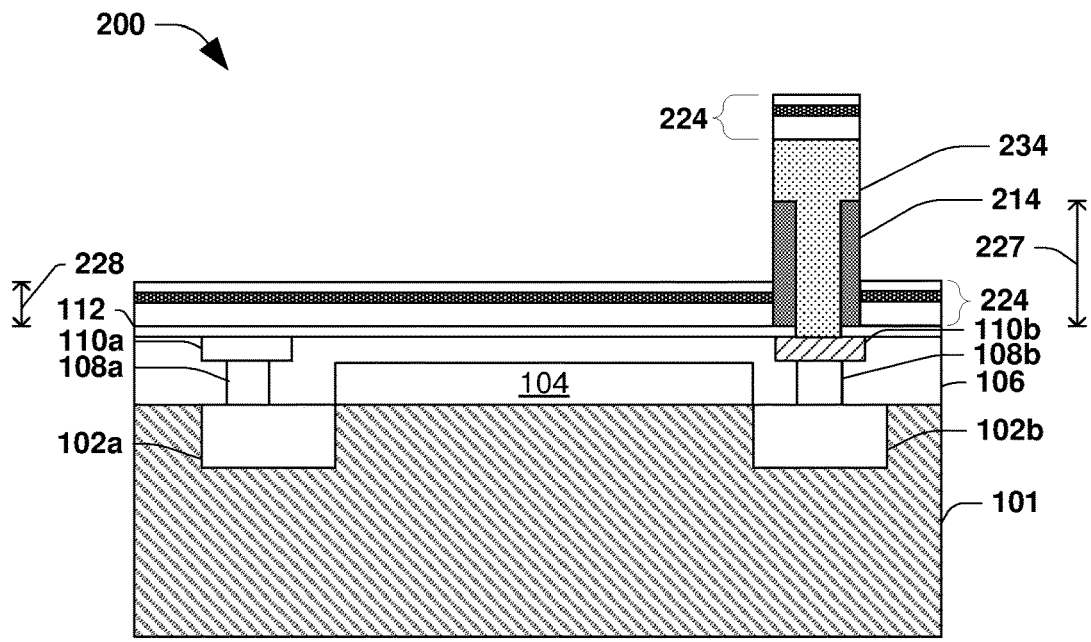

Referring to FIG. 13, in some embodiments, a MTJ stack 224 is formed over the etch stop layer 112, the metal structure 234, and adjacent to a sidewall of the remnant of the second dielectric layer 214. In some embodiments, the MTJ stack 224 comprises a first magnetic layer, a tunnel layer over the first magnetic layer, and a second magnetic layer over the tunnel layer. In some embodiments, at least one of the layers of the MTJ stack 224 is formed by at least one of PVD, sputtering, CVD, LPCVD, ALCVD, UHVCVD, RPCVD, MBE, LPE, or other suitable techniques. According to some embodiments, a sidewall of the first magnetic layer, a sidewall of the tunnel layer, and a sidewall of the second magnetic layer contact a sidewall of the second dielectric layer 214.

According to some embodiments, the first magnetic layer is formed to have a permanent magnetization direction. In some embodiments, the first magnetic layer comprises at least one of Ni, Fe, Mn, Co, CoFeB, CoFe, NiFe, NiMnSb, PtMnSb, PtMnSb, Fe$_3$O$_4$, CrO$_2$, CoCr, CoPt, CoCrPt, CoFe, CoFeCr, CoFePt, CoFeCrPt, or other suitable materials.

According to some embodiments, the tunnel layer comprises a non-magnetic material. According to some embodiments, the tunnel layer comprises an insulator material. In some embodiments, the tunnel layer comprises at least one of magnesium oxide (MgO), Al$_2$O$_3$, aluminum nitride (AlN), aluminum oxynitride (AlON), or other suitable materials. In some embodiments, the tunnel layer has a thickness between 5 angstroms and 15 angstroms. According to some embodiments, the second magnetic layer is formed to have a permanent magnetization direction. According to some embodiments, the second magnetic layer 122 comprises at least one of Ni, Fe, Mn, Co, CoFeB, CoFe, NiFe, NiMnSb, PtMnSb, PtMnSb, Fe$_3$O$_4$, CrO$_2$, CoCr, CoPt, CoCrPt, CoFe, CoFeCr, CoFePt, CoFeCrPt, or other suitable materials. According to some embodiments, the first magnetic layer and the second magnetic layer have a same material composition.

According to some embodiments, a height 227 of the via portion 223a is selected to be greater than a height 228 of the subsequently formed MTJ stack 224 to mitigate a possible short between the MTJ stack 224 and the metal structure 234. That is, the height of the via portion 223a is selected to be greater than a height of the subsequently formed MTJ stack 224 so that the sidewall of the MTJ stack 224 only contacts the remnant portion of the second dielectric layer 214 and does not contact the MTJ stack 224.

Figure 14:
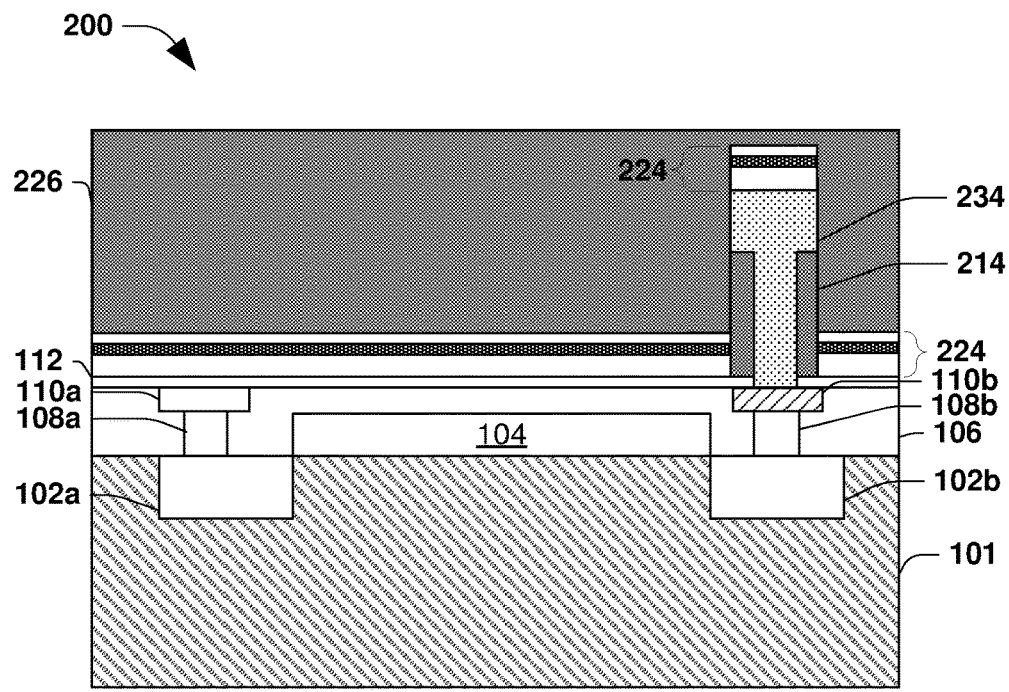

Referring to FIG. 14, according to some embodiments, a third dielectric layer 226 is formed over MTJ stack 224 and adjacent a sidewall of the remnant of the second dielectric layer 214. According to some embodiments, the sidewall of the third dielectric layer 226 contacts the sidewall of the second dielectric layer 214 and contacts sidewalls of a portion of the MTJ stack 224, such as the first magnetic layer, the tunnel layer, and the second magnetic layer overlying the metal structure 234.

In some embodiments, the third dielectric layer 226 is formed by at least one of PVD, sputtering, CVD, LPCVD, ALCVD, UHVCVD, RPCVD, MBE, LPE, or other suitable techniques. In some embodiments, the third dielectric layer 226 comprises at least one of a metal nitride, a high-k dielectric, a rare earth oxide, an aluminate of a rare earth oxide, a silicate of a rare earth oxide, or other suitable materials. According to some embodiments, the third dielectric layer 226 comprises at least one of SiN, SiO$_2$, Si$_3$N$_4$, TiO$_2$, Ta$_2$O$_5$, ZrO$_2$, Y$_2$O$_3$, La$_2$O$_5$, HfO$_2$, or other suitable materials. According to some embodiments, the second dielectric layer 214 and the third dielectric layer 226 have a same material composition.

Figure 15:
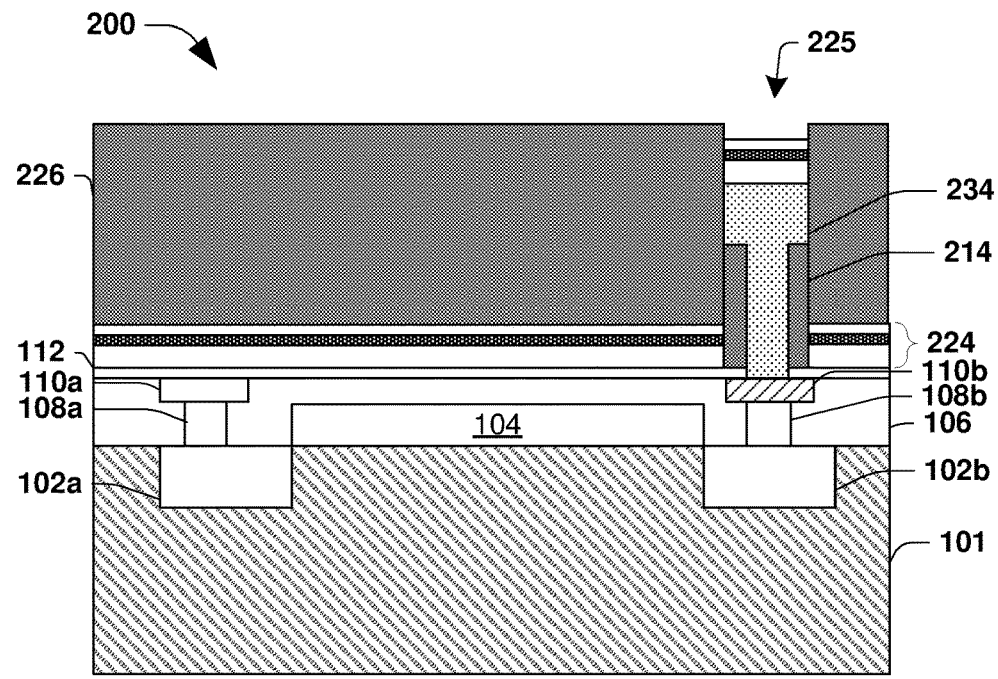

Referring to FIG. 15, the third dielectric layer 226 is patterned to form a second opening 225 and expose a portion of the MTJ stack 224 over the metal structure 234, according to some embodiments. According to some embodiments, the third dielectric layer 226 is patterned by at least one of plasma etching, RIE, wet etching, or other suitable techniques. In some embodiments, a photoresist is used in patterning the third dielectric layer 226.

Figure 16:
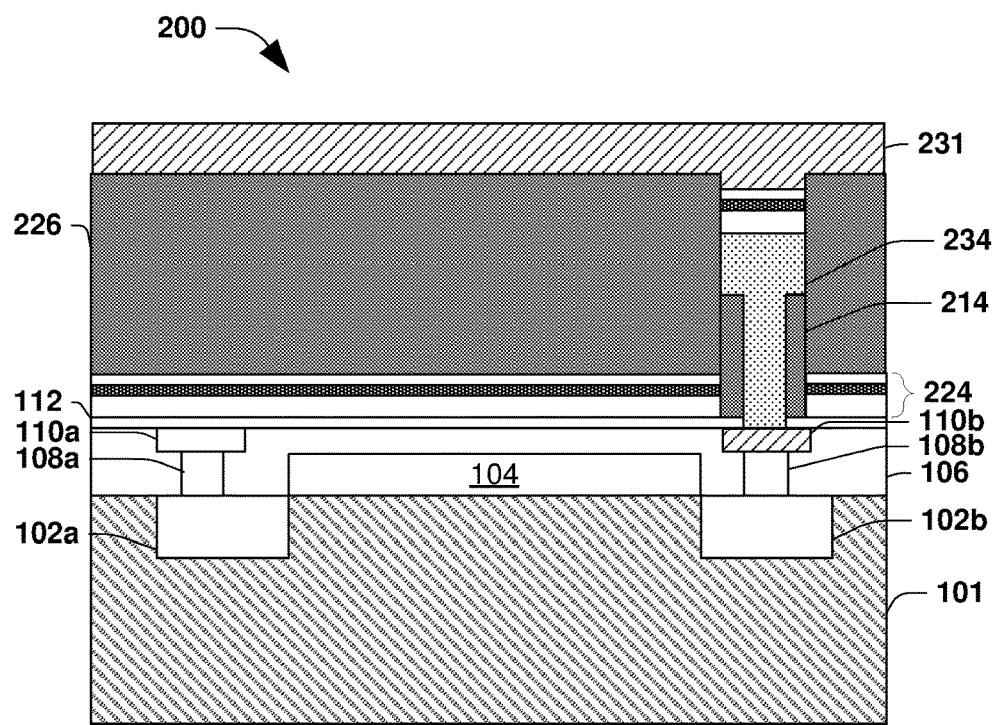

Referring to FIG. 16, a layer of conductive material 231 is formed over the third dielectric layer 226 and in the second opening 225 over the MTJ stack 224. According to some embodiments, the layer of conductive material 231 comprises at least one of Co, Ni, W, Ti, Ta, Cu, Al, Mo, TiN, TaN, WSi, Ni—Si, Co—Si, WN, TiAlN, TaCN, TaC, TaSiN, or other suitable materials. According to some embodiments, the layer of conductive material 231 is formed by at least one of PVD, sputtering, CVD, LPCVD, ALCVD, UHVCVD, RPCVD, MBE, LPE, electrochemical plating (ECP), or other suitable techniques.

Figure 17:
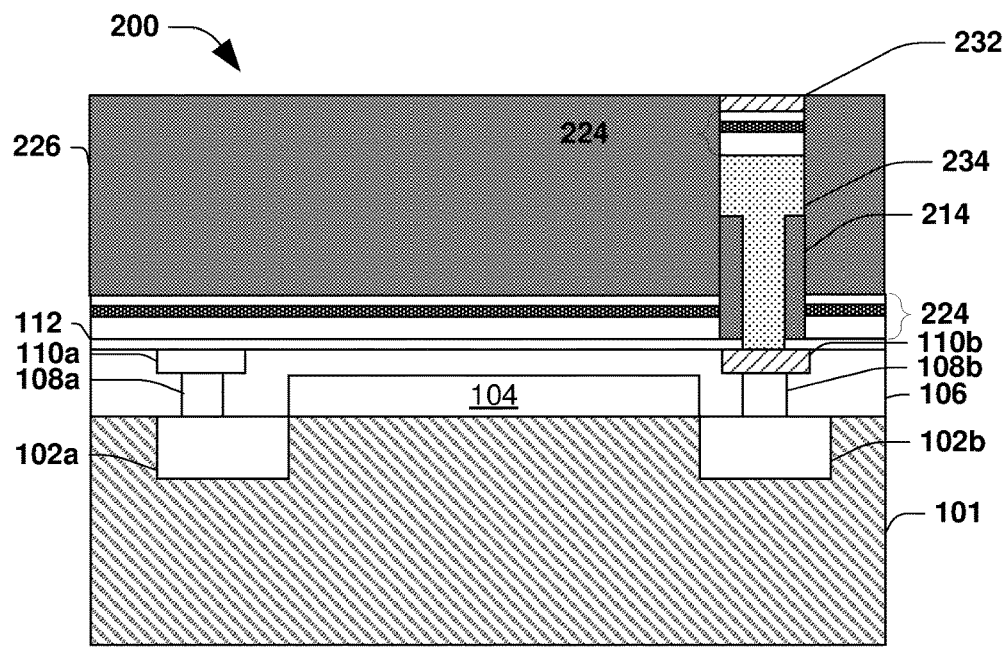

Referring to FIG. 17, portions of the layer of conductive material 231 not in the second opening 225 are removed to form an electrode 232 over the MTJ stack 224 and adjacent to the third dielectric layer 226. According to some embodiments, the electrode 232 is electromagnetically coupled with the MTJ stack 224. According to some embodiments, the portions of the layer of conductive material 231 not in the second opening 225 are removed by at least one of CMP, or other suitable techniques. In some embodiments, an uppermost surface of the electrode 232 is coplanar with an uppermost surface of the third dielectric layer 226.

According to some embodiments, the semiconductor device 200 includes an electrical connection to the second source/drain region 102b by way of the electrode 232, the MTJ stack 224, the metal structure 234, the second contact 110b, and the conductive member 108b. According to some embodiments, data is written to the semiconductor device 200 by altering a magnetic field direction of one of the magnetic layers of the MTJ stack 224. It may be appreciated that the portion of the MTJ stack 224 underlying (or covered by) the third dielectric layer 226 may be referred to as a dummy MTJ stack because this portion of the MTJ stack is not used for storing data and is merely a remnant of the formation process.

Figure 18:
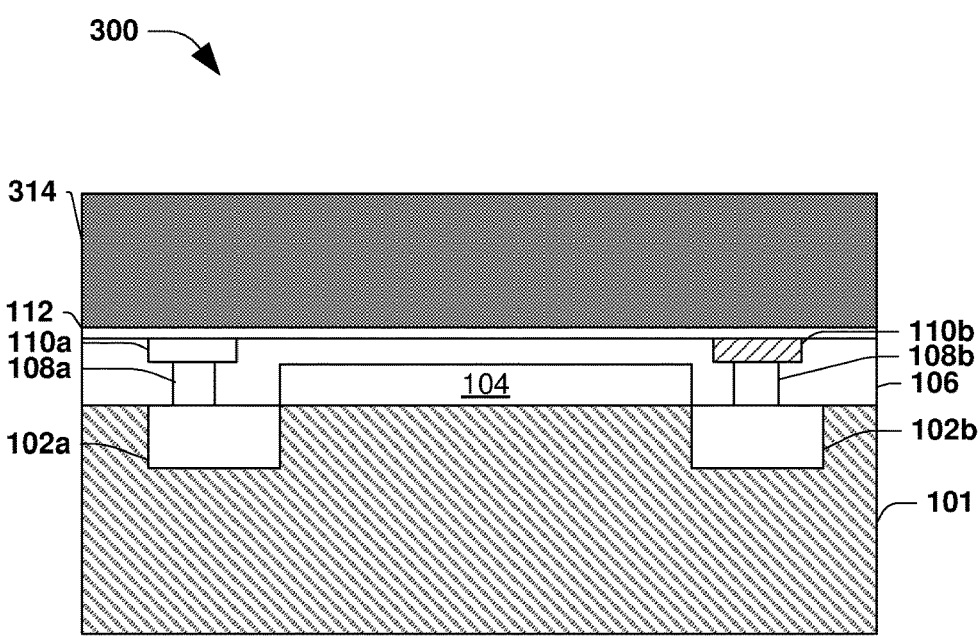
FIGS. 18-28 are illustrations of a semiconductor device at various stages of fabrication, in accordance with one or more embodiments.

Turning to FIG. 18, at least some of a semiconductor device 300 is formed on a substrate 101. In some embodiments, the substrate 101 comprises at least one of an epitaxial layer, a silicon-on-insulator (SOI) structure, a wafer, or a die formed from a wafer. In some embodiments, the substrate 101 comprises at least one of silicon, germanium, carbide, gallium, arsenide, germanium, arsenic, indium, oxide, sapphire, or other suitable materials. In some embodiments, the substrate 101 is at least one of a p-type substrate (P-substrate) or an n-type substrate (N-substrate). In some embodiments, the substrate 101 comprises at least one of a doped epitaxial layer, a gradient semiconductor layer, or a plurality of semiconductor layers where one or more of the semiconductor layers are of a different type than another layer of the plurality of semiconductor layers. In some embodiments, the substrate 101 comprises at least one of a p-well or an n-well.

According to some embodiments, the substrate 101 includes an insulator layer. In some embodiments, the insulator layer comprises at least one of silicon oxide, sapphire, or other suitable materials. In some embodiments, the insulator layer comprises a buried oxide layer (BOX). In some embodiments, the insulator layer is formed by at least one of implantation, oxidation, deposition, or other suitable techniques. In some embodiments, the insulator layer is a component of a SOI structure.

Still referring to FIG. 18, a first source/drain region 102a and a second source/drain region 102b are formed in the substrate 101. The first source/drain region 102a is coupled to a first contact 110a by a conductive member 108a. The second source/drain region 102b is coupled to a second contact by a conductive member 108b. In some embodiments, at least one of the first source/drain region 102a or the second source/drain region 102b is formed by at least one of ion implantation, in situ doping, or other suitable techniques. A gate stack 104, including a gate electrode, is formed over the substrate 101.

A first dielectric layer 106 is formed over at least one of the substrate 101, the gate stack 104, the first source/drain region 102a, or the second source/drain region 102b. According to some embodiments, the first dielectric layer 106 is formed by at least one of PVD, sputtering, CVD, LPCVD, ALCVD, UHVCVD, RPCVD, MBE, LPE, or other suitable techniques. In some embodiments, the first dielectric layer 106 comprises at least one of a metal nitride, a high-k dielectric, a rare earth oxide, an aluminate of a rare earth oxide, a silicate of a rare earth oxide, or other suitable materials. According to some embodiments, the first dielectric layer 106 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials. According to some embodiments, one or more openings are formed in the first dielectric layer 106, such as by etching, and at least one of the first contact 110a, the conductive member 108a, the second contact 110b, or the conductive member 108b are formed in the at least one of the one or more openings Still referring to FIG. 18, an etch stop layer 112 is formed over the first dielectric layer 106. In some embodiments, the etch stop layer 112 is formed by at least one of PVD, sputtering, CVD, LPCVD, ALCVD, UHVCVD, RPCVD, MBE, LPE, or other suitable techniques. In some embodiments, the etch stop layer 112 comprises at least one of SiON, SiN, SiC, carbon doped silicon oxide, or other suitable materials.

Still referring to FIG. 18, a second dielectric layer 314 is formed over the etch stop layer 112. According to some embodiments, the second dielectric layer 314 is formed by at least one of PVD, sputtering, CVD, LPCVD, ALCVD, UHVCVD, RPCVD, MBE, LPE, or other suitable techniques. In some embodiments, the second dielectric layer 314 comprises at least one of a metal nitride, a high-k dielectric, a rare earth oxide, an aluminate of a rare earth oxide, a silicate of a rare earth oxide, or other suitable materials. According to some embodiments, the second dielectric layer 314 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials.

Figure 19:
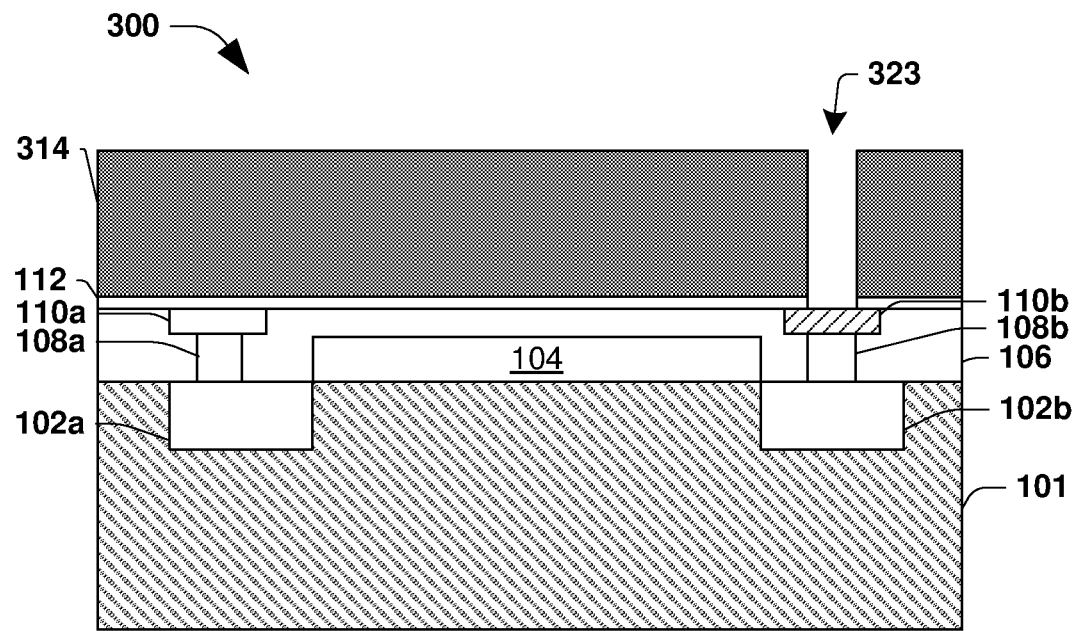

Referring to FIG. 19, according to some embodiments, the second dielectric layer 314 and the etch stop layer 112 are patterned to form an opening 323 and expose the second contact 110b. In some embodiments, at least one of the second dielectric layer 314 or the etch stop layer 112 are patterned by a single damascene process. In some embodiments, at least one of the second dielectric layer 314 or the etch stop layer 112 are patterned by at least one of plasma etching, reactive ion etching (RIE), wet etching, or other suitable techniques. In some embodiments, a photoresist is used in patterning at least one of the second dielectric layer 314 or the etch stop layer 112.

Figure 20:
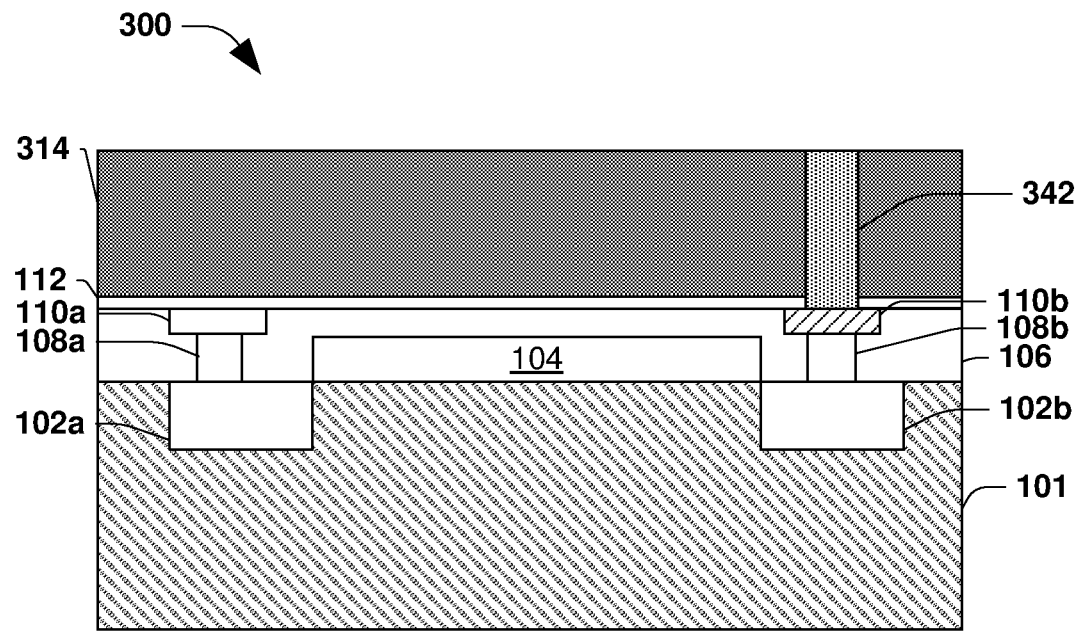

Referring to FIG. 20, in some embodiments, a metal structure 342 is formed in the opening 323 and over the second contact 110b. In some embodiments, the metal structure 342 comprises at least one of Co, Ni, W, Ti, Ta, Cu, Al, Mo, TiN, TaN, WSi, Ni—Si, Co—Si, WN, TiAlN, TaCN, TaC, TaSiN, or other suitable materials. In some embodiments, the metal structure 342 is formed by at least one of PVD, sputtering, CVD, LPCVD, ALCVD, UHVCVD, RPCVD, MBE, LPE, ECP, or other suitable techniques. In some embodiments, the metal structure 342 is subjected to CMP. In some embodiments, an uppermost surface of the metal structure 342 is coplanar with an uppermost surface of the second dielectric layer 314.

Figure 21:
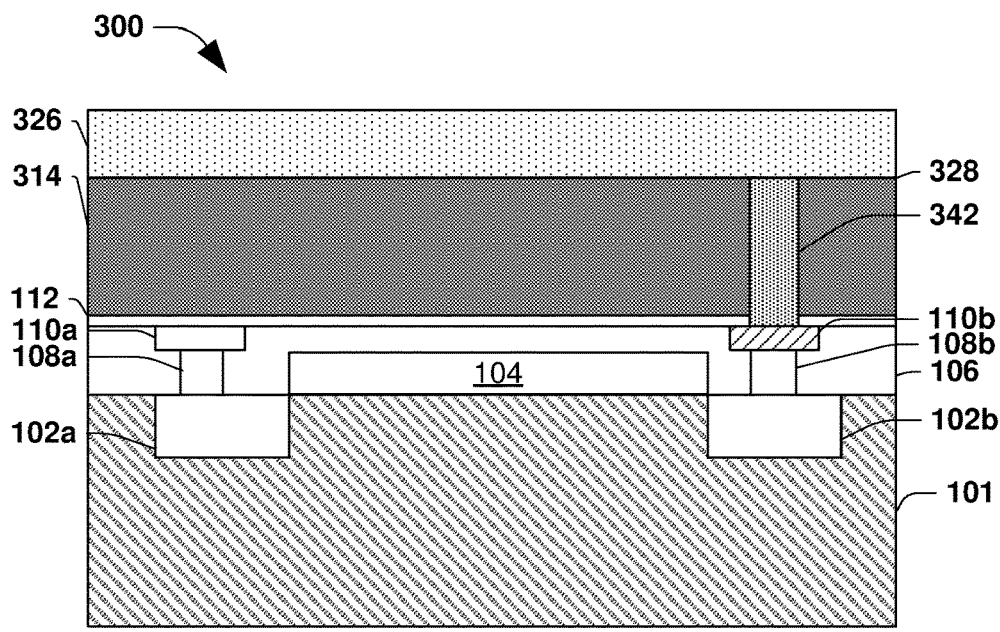

Referring to FIG. 21, a third dielectric layer 326 is formed over the second dielectric layer 314 and the metal structure 342. According to some embodiments, the third dielectric layer 326 is formed by at least one of PVD, sputtering, CVD, LPCVD, ALCVD, UHVCVD, RPCVD, MBE, LPE, or other suitable techniques. In some embodiments, the third dielectric layer 326 comprises at least one of a metal nitride, a high-k dielectric, a rare earth oxide, an aluminate of a rare earth oxide, a silicate of a rare earth oxide, or other suitable materials. According to some embodiments, the third dielectric layer 326 comprises at least one of SiN, SiO$_2$, Si$_3$N$_4$, TiO$_2$, Ta$_2$O$_5$, ZrO$_2$, Y$_2$O$_3$, La$_2$O$_5$, HfO$_2$, or other suitable materials. According to some embodiments, the second dielectric layer 314 and the third dielectric layer 326 have a same material composition.

Still referring to FIG. 21, according to some embodiments, a first interface 328 is defined where the third dielectric layer 326 contacts the second dielectric layer 314.

Figure 22:
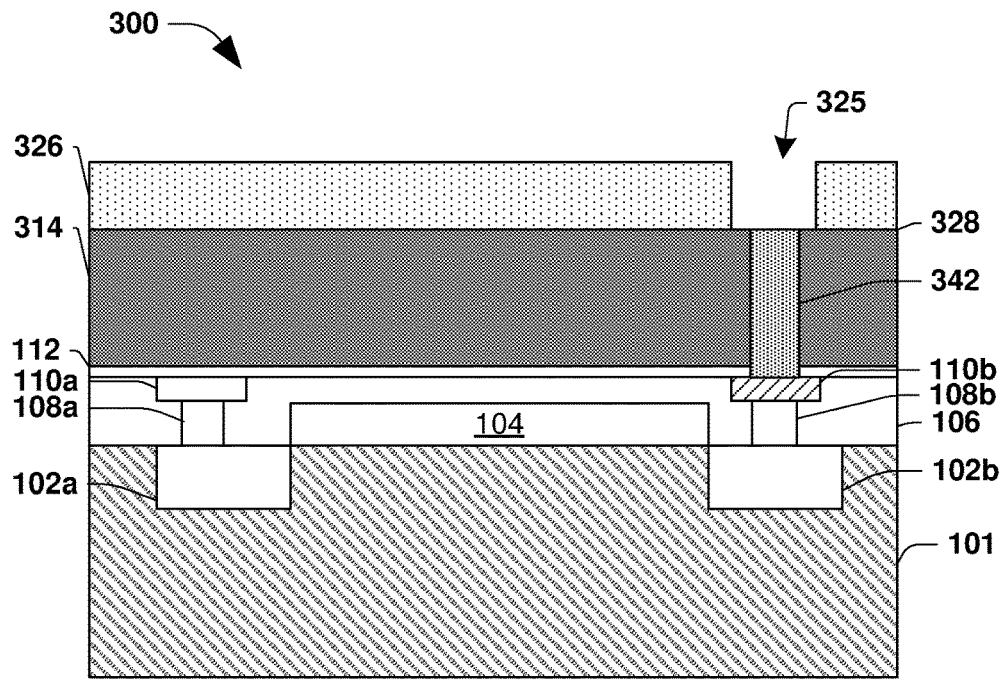

Referring to FIG. 22, the third dielectric layer 326 is patterned to form a second opening 325 and expose the metal structure 342, according to some embodiments. According to some embodiments, the third dielectric layer 326 is patterned by at least one of plasma etching, RIE, wet etching, or other suitable techniques. In some embodiments, a photoresist is used in patterning the third dielectric layer 326. In some embodiments a width of the opening 325 is greater than a width of the metal structure 342

Figure 23:
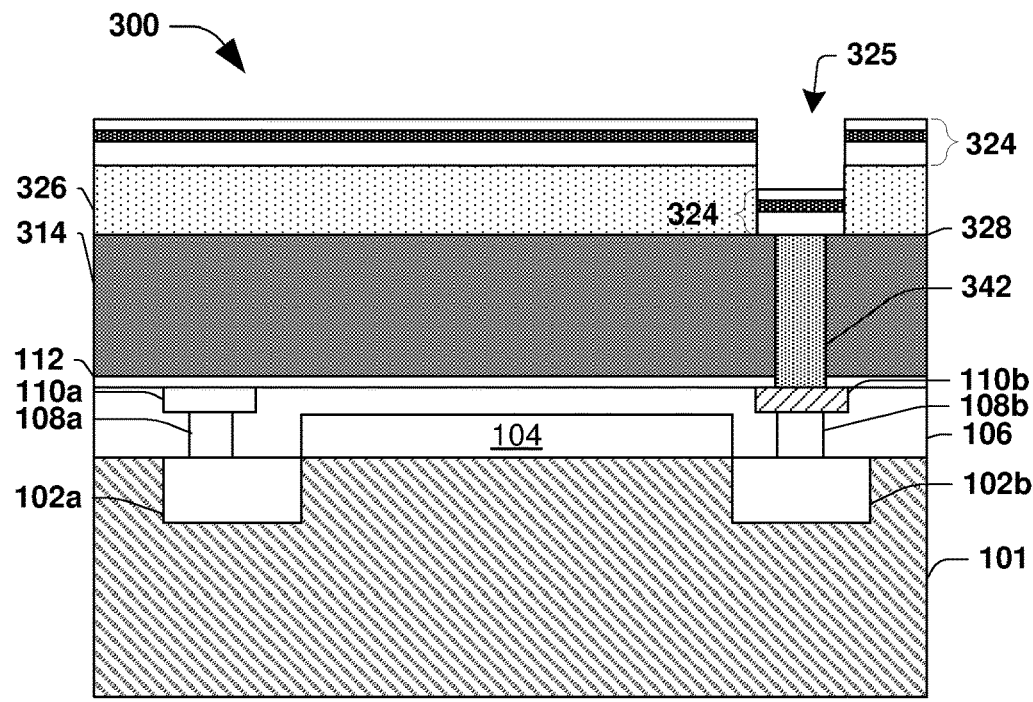

Referring to FIG. 23, in some embodiments, a MTJ stack 324 is formed over the third dielectric layer 326 and in the second opening 325 over the metal structure 342. In some embodiments, the MTJ stack 224 comprises a first magnetic layer, a tunnel layer over the first magnetic layer, and a second magnetic layer over the tunnel layer. In some embodiments, at least one of the layers of the MTJ stack 324 is formed by at least one of PVD, sputtering, CVD, LPCVD, ALCVD, UHVCVD, RPCVD, MBE, LPE, or other suitable techniques. According to some embodiments, the first magnetic layer is formed to have a permanent magnetization direction. In some embodiments, the first magnetic layer comprises at least one of Ni, Fe, Mn, Co, CoFeB, CoFe, NiFe, NiMnSb, PtMnSb, PtMnSb, Fe$_3$O$_4$, CrO$_2$, CoCr, CoPt, CoCrPt, CoFe, CoFeCr, CoFePt, CoFeCrPt, or other suitable materials. According to some embodiments, the tunnel layer comprises a non-magnetic material. According to some embodiments, the tunnel layer comprises an insulator material. In some embodiments, the tunnel layer comprises at least one of magnesium oxide (MgO), Al$_2$O$_3$, aluminum nitride (AlN), aluminum oxynitride (AlON), or other suitable materials. In some embodiments, the tunnel layer has a thickness between 5 angstroms and 15 angstroms. According to some embodiments, the second magnetic layer is formed to have a permanent magnetization direction. According to some embodiments, the second magnetic layer comprises at least one of Ni, Fe, Mn, Co, CoFeB, CoFe, NiFe, NiMnSb, PtMnSb, PtMnSb, Fe$_3$O$_4$, CrO$_2$, CoCr, CoPt, CoCrPt, CoFe, CoFeCr, CoFePt, CoFeCrPt, or other suitable materials. According to some embodiments, the first magnetic layer and the second magnetic layer have a same material composition.

According to some embodiments, the height of the second opening 325 is selected to be greater than a height of the subsequently formed MTJ stack 324. In some embodiments, an uppermost surface of the portion of the MTJ stack 324 in the second opening 325 is not coplanar with an uppermost surface of the third dielectric layer 326. In some embodiments, the uppermost surface of the portion of the MTJ stack 324 in the second opening 325 is below the uppermost surface of the third dielectric layer 326. In some embodiments, the uppermost surface of the portion of the MTJ stack 324 in the second opening 325 is coplanar with the uppermost surface of the third dielectric layer 326.

Figure 24:
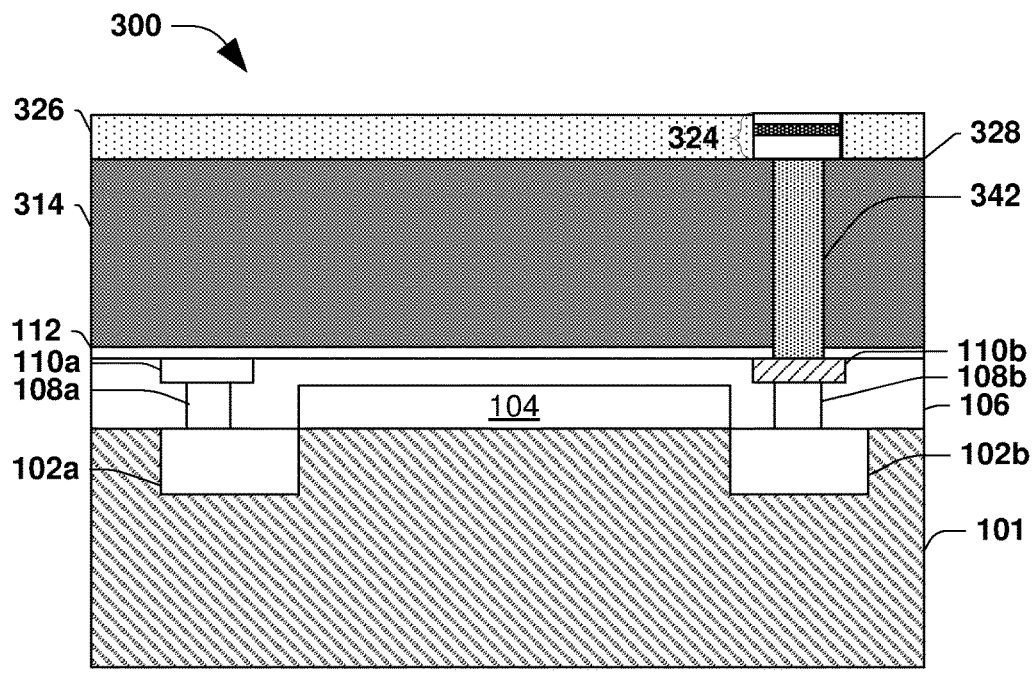

Referring to FIG. 24, according to some embodiments, portions of the MTJ stack 324 not in the second opening 325 are removed. According to some embodiments, portions of the third dielectric layer 326 extending above the uppermost surface of the portion of the MTJ stack 324 in the second opening 325 are removed. According to some embodiments, at least one of the portions of the MTJ stack 324 not in the second opening 325 or the portions of the third dielectric layer 326 extending above the uppermost surface of the portion of the MTJ stack 324 in the second opening 325 are removed by at least one of CMP or other suitable techniques. In some embodiments, the uppermost surface of the MTJ stack 324 is coplanar with the uppermost surface of the third dielectric layer 326 after the portions of the MTJ stack 324 not in the second opening 325 are removed. In some embodiments, the uppermost surface of the portion of the MTJ stack 324 in the second opening 325 is below the uppermost surface of the third dielectric layer 326 after the portions of the MTJ stack 324 not in the second opening 325 are removed.

Figure 25:
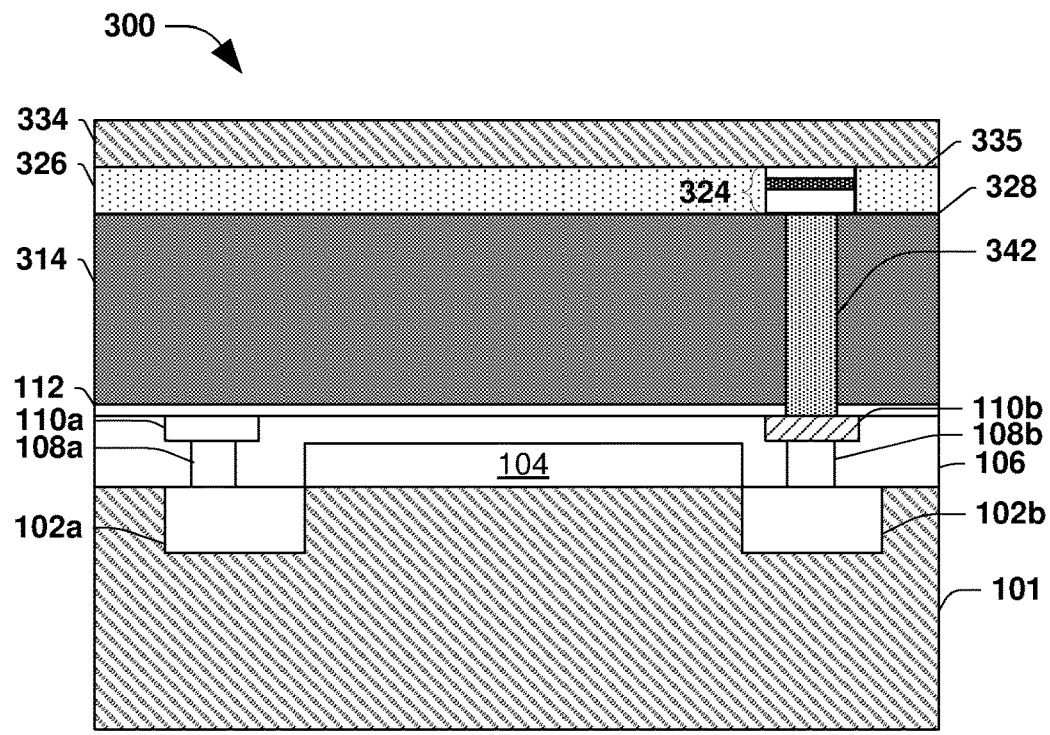

Referring to FIG. 25, a fourth dielectric layer 334 is formed over the third dielectric layer 326 and the MTJ stack 324. According to some embodiments, the fourth dielectric layer 334 is formed by at least one of PVD, sputtering, CVD, LPCVD, ALCVD, UHVCVD, RPCVD, MBE, LPE, or other suitable techniques. In some embodiments, the fourth dielectric layer 334 comprises at least one of a metal nitride, a high-k dielectric, a rare earth oxide, an aluminate of a rare earth oxide, a silicate of a rare earth oxide, or other suitable materials. According to some embodiments, the third dielectric layer 326 comprises at least one of SiN, SiO$_2$, Si$_3$N$_4$, TiO$_2$, Ta$_2$O$_5$, ZrO$_2$, Y$_2$O$_3$, La$_2$O$_5$, HfO$_2$, or other suitable materials. According to some embodiments, the second dielectric layer 214 and the fourth dielectric layer 334 have a same material composition. According to some embodiments, the third dielectric layer 326 and the fourth dielectric layer 334 have a same material composition.

Still referring to FIG. 25, according to some embodiments, a second interface 335 is defined where the fourth dielectric layer 334 contacts the third dielectric layer 326.

Figure 26:
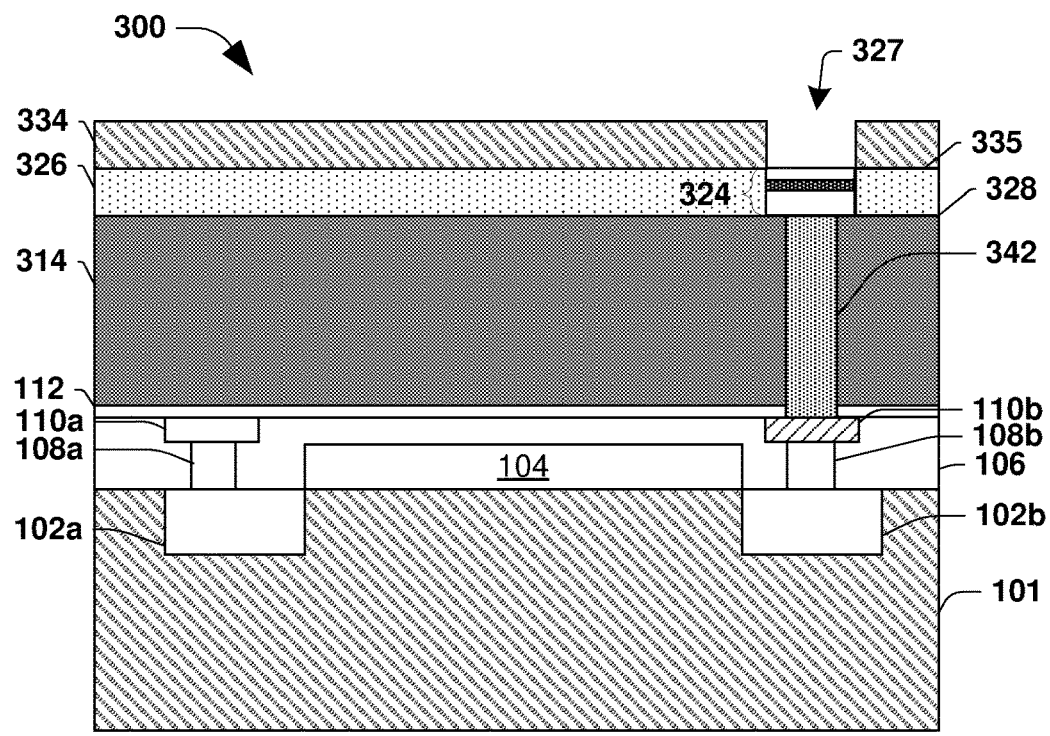

Referring to FIG. 26, the fourth dielectric layer 334 is patterned to form a third opening 327 and expose the MTJ stack 324, according to some embodiments. According to some embodiments, the fourth dielectric layer 334 is patterned by at least one of plasma etching, RIE, wet etching, or other suitable techniques. In some embodiments, a photoresist is used in patterning the third dielectric layer 326.

Figure 27:
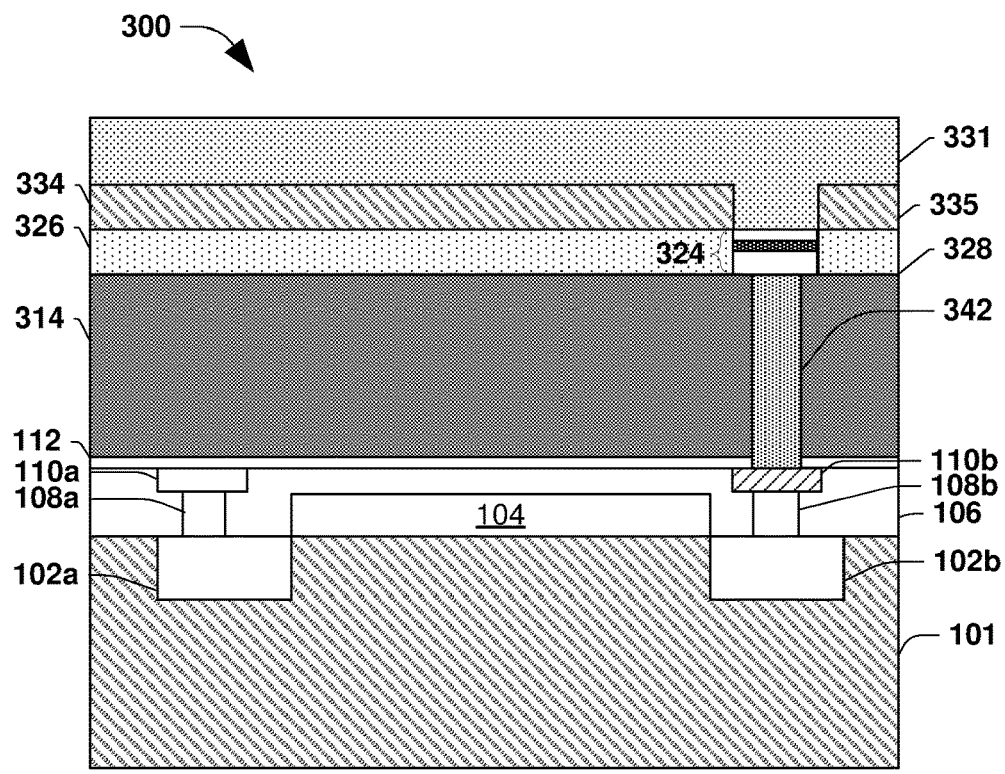

Referring to FIG. 27, a layer of conductive material 331 is formed over fourth dielectric layer 334 and in the third opening 327 over the MTJ stack 324. According to some embodiments, the layer of conductive material 331 comprises at least one of Co, Ni, W, Ti, Ta, Cu, Al, Mo, TiN, TaN, WSi, Ni—Si, Co—Si, WN, TiAlN, TaCN, TaC, TaSiN, or other suitable materials. According to some embodiments, the layer of conductive material 331 is formed by at least one of PVD, sputtering, CVD, LPCVD, ALCVD, UHVCVD, RPCVD, MBE, LPE, electrochemical plating (ECP), or other suitable techniques.

Figure 28:
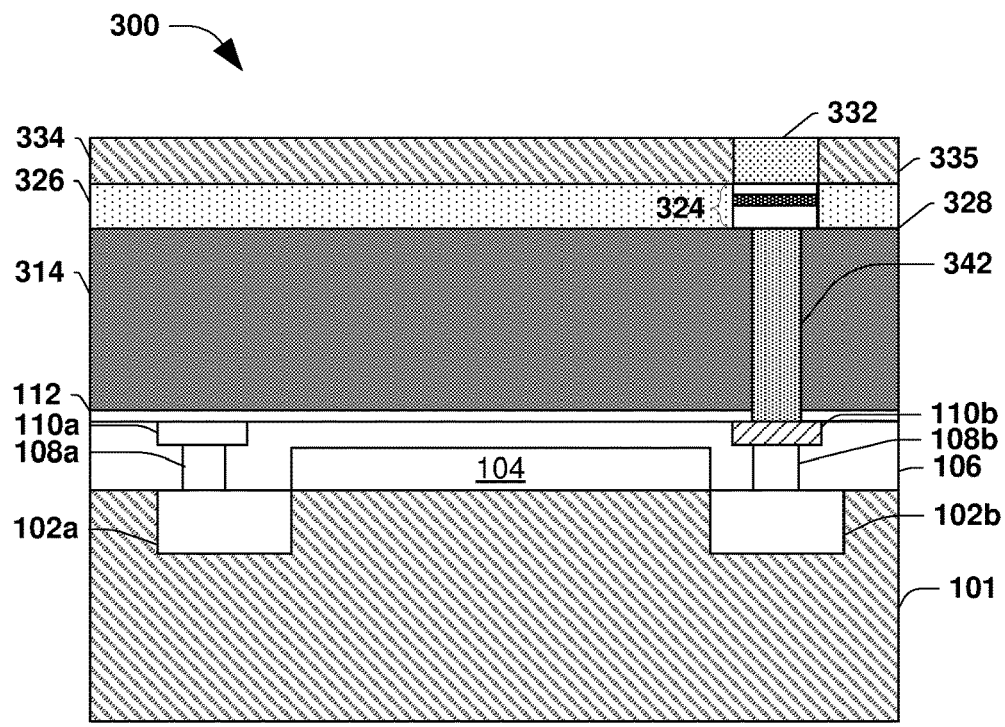

Referring to FIG. 28, portions of the layer of conductive material 331 not in the third opening 327 are removed to form an electrode 332 over the MTJ stack 324. According to some embodiments, the electrode 332 is electromagnetically coupled with the MTJ stack 324. According to some embodiments, the portions of the layer of conductive material 331 not in the third opening 327 are removed by at least one of CMP, or other suitable techniques. In some embodiments, an uppermost surface of the electrode 332 is coplanar with an uppermost surface of the fourth dielectric layer 334.

According to some embodiments, the semiconductor device 300 includes an electrical connection to the second source/drain region 102b by way of the electrode 332, the MTJ stack 324, the metal structure 342, the second contact 110b, and the conductive member 108b. According to some embodiments, data is written to the semiconductor device 300 by altering a magnetic field direction of one of the magnetic layers of the MTJ stack 324.

According to some embodiments, the processes described herein enable the formation of MTJs without etching the MTJs using an ion beam etch (IBE). As such, a re-deposition of the MTJ due to sputtering during the IBE, which can result in short-circuiting of the MTJ, can be mitigated and damage to other layers, such as the etch stop layer, can be mitigated, improving the overall performance of the semiconductor device. Moreover, it will be appreciated that while the aforementioned embodiments illustrate the formation of the MTJ stack in dielectric layers close to the source/drain regions, in some embodiments, the MTJ stack may be formed in dielectric layers further away from the source/drain regions and via structures or other conductive structures may be formed between the contacts and the MTJ stack to connect the source/drain region to the MTJ stack.

According to some embodiments, a semiconductor device is provided. The semiconductor device includes a semiconductor layer including a source/drain region, a first magnetic layer over the semiconductor layer, and a first dielectric layer over the source/drain region and adjacent the first magnetic layer. The semiconductor device includes a metal structure extending through the first dielectric layer, a second magnetic layer over the metal structure, and a second dielectric layer over the first magnetic layer and adjacent the first dielectric layer.

According to some embodiments, the first magnetic layer and the second magnetic layer have a same material composition.

According to some embodiments, the second dielectric layer is adjacent the second magnetic layer.

According to some embodiments, a sidewall of the first dielectric layer contacts a sidewall of the first magnetic layer and a sidewall of the second dielectric layer.

According to some embodiments, the semiconductor device includes an electrode over the second magnetic layer and adjacent the second dielectric layer.

According to some embodiments, the semiconductor device includes a first insulator over the first magnetic layer and a third magnetic layer over the first insulator. The first magnetic layer, the first insulator, and the third magnetic layer define a dummy magnetic tunnel junction.

According to some embodiments, the semiconductor device includes a first insulator over the second magnetic layer, and a third magnetic layer over the first insulator. The second magnetic layer, the first insulator, and the third magnetic layer define a magnetic tunnel junction.

According to some embodiments, a sidewall of the second dielectric layer contacts a sidewall of the first dielectric layer and a sidewall of the first magnetic layer.

According to some embodiments, the sidewall of the second dielectric layer contacts a sidewall of the metal structure.

According to some embodiments, a semiconductor device is provided. The semiconductor device has a semiconductor layer including a source/drain region, a first dielectric layer over the semiconductor layer, and a first magnetic layer over the source/drain region and adjacent the first dielectric layer. The semiconductor device has a second dielectric layer over the first dielectric layer, wherein an interface is defined where the second dielectric layer contacts the first dielectric layer, and an electrode over the first magnetic layer and adjacent the second dielectric layer.

According to some embodiments, the semiconductor device includes a metal structure over the source/drain region, wherein the metal structure is between the source/drain region and the first magnetic layer.

According to some embodiments, the semiconductor device includes an insulator over the first magnetic layer and a second magnetic layer over the insulator, wherein the insulator and the second magnetic layer are between the first magnetic layer and the electrode.

According to some embodiments, the semiconductor device includes a second dielectric layer under the first dielectric layer and a contact adjacent the second dielectric layer and over the source/drain region.

According to some embodiments, the first magnetic layer contacts a top surface of the contact.

According to some embodiments, the semiconductor device includes a metal structure over the contact, wherein the metal structure is between the contact and the first magnetic layer.

According to some embodiments, a method of forming a semiconductor device is provided. The method includes forming a first dielectric layer over a source/drain region, forming a first opening in the first dielectric layer over the source/drain region, and forming a metal structure in the first opening. The method includes removing a first portion of the first dielectric layer while maintaining a second portion of the first dielectric layer underlying the metal structure, and forming a first magnetic layer over a semiconductor layer including the source/drain region. The first magnetic layer is adjacent the second portion of the first dielectric layer.

According to some embodiments, the method includes forming a second magnetic layer over the metal structure.

According to some embodiments, the forming the first magnetic layer and forming the second magnetic layer includes concurrently forming the first magnetic layer and the second magnetic layer.

According to some embodiments, the method includes forming a second dielectric layer over the first magnetic layer and adjacent the first dielectric layer.

According to some embodiments, the method includes forming a second magnetic layer over the metal structure prior to forming the second dielectric layer. Forming the second dielectric layer includes forming the second dielectric layer over the second magnetic layer. The method also includes removing a portion of the second dielectric layer over the second magnetic layer to form a second opening and forming a contact in the second opening.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a substrate comprising a source/drain region;
a first magnetic layer over the substrate;
a first dielectric layer over the source/drain region and adjacent to the first magnetic layer;
a metal structure extending through the first dielectric layer;
a second magnetic layer over the metal structure; and
a second dielectric layer over the first magnetic layer and adjacent to the first dielectric layer, wherein a sidewall of the first dielectric layer contacts a sidewall of the first magnetic layer and a sidewall of the second dielectric layer.

2. The semiconductor device of claim 1, wherein the first magnetic layer and the second magnetic layer have a same material composition.

3. The semiconductor device of claim 1, wherein the second dielectric layer is adjacent to the second magnetic layer.

4. The semiconductor device of claim 1, further comprising:
an electrode over the second magnetic layer and adjacent to the second dielectric layer.

5. The semiconductor device of claim 1, further comprising:
a tunnel layer over the first magnetic layer; and
a third magnetic layer over the tunnel layer, wherein the first magnetic layer, the tunnel layer, and the third magnetic layer define a dummy magnetic tunnel junction stack.

6. The semiconductor device of claim 1, further comprising:
a tunnel layer over the second magnetic layer; and
a third magnetic layer over the tunnel layer, wherein the second magnetic layer, the tunnel layer, and the third magnetic layer define a magnetic tunnel junction.

7. The semiconductor device of claim 1, wherein the sidewall of the second dielectric layer contacts a sidewall of the second magnetic layer.

8. The semiconductor device of claim 1, wherein the sidewall of the second dielectric layer contacts a sidewall of the metal structure.

9. A semiconductor device, comprising:
a substrate comprising a source/drain region;
a first magnetic tunnel junction (MTJ) stack overlying the source/drain region, wherein the first MTJ stack comprises:
a first magnetic layer;
a tunnel layer over the first magnetic layer; and
a second magnetic layer over the tunnel layer;
an etch stop layer, wherein the first MTJ stack is laterally adjacent to the etch stop layer;
a first dielectric layer over the etch stop layer and laterally adjacent to the first magnetic layer, the tunnel layer, and the second magnetic layer; and
an electrode over the first MTJ stack.

10. The semiconductor device of claim 9, wherein the first dielectric layer underlies the electrode.

11. The semiconductor device of claim 9, further comprising:
a second dielectric layer, wherein the electrode is laterally adjacent to the second dielectric layer.

12. The semiconductor device of claim 11, wherein the second dielectric layer contacts the first dielectric layer.

13. The semiconductor device of claim 9, wherein a sidewall of the first magnetic layer contacts the etch stop layer.

14. The semiconductor device of claim 13, wherein the sidewall of the first magnetic layer contacts the first dielectric layer.

15. A semiconductor device, comprising:
a substrate comprising a source/drain region;

a first magnetic layer over the substrate;

a first dielectric layer over the source/drain region and adjacent to the first magnetic layer;

a metal structure extending through the first dielectric layer;

a second magnetic layer over the metal structure;

a first tunnel layer over the second magnetic layer;

a third magnetic layer over the first tunnel layer, wherein the second magnetic layer, the first tunnel layer, and the third magnetic layer define a magnetic tunnel junction; and a second dielectric layer over the first magnetic layer and adjacent to the first dielectric layer.

16. The semiconductor device of claim 15, wherein the first dielectric layer is laterally adjacent to the first magnetic layer.

17. The semiconductor device of claim 15, wherein the second dielectric layer is laterally adjacent to the first dielectric layer.

18. The semiconductor device of claim 15, further comprising:

a second tunnel layer over the first magnetic layer; and a fourth magnetic layer over the second tunnel layer, wherein the first magnetic layer, the second tunnel layer, and the fourth magnetic layer define a dummy magnetic tunnel junction stack.

19. The semiconductor device of claim 15, wherein a sidewall of the second dielectric layer contacts a sidewall of the first dielectric layer and a sidewall of the second magnetic layer.

20. The semiconductor device of claim 15, wherein the first magnetic layer and the second magnetic layer have a same material composition.

* * * * *